(12) United States Patent
Yun et al.

(10) Patent No.: US 12,433,088 B2
(45) Date of Patent: Sep. 30, 2025

(54) SENSOR EMBEDDED DISPLAY PANEL AND ELECTRONIC DEVICE

(71) Applicant: Samsung Electronics Co., Ltd., Suwon-si (KR)

(72) Inventors: Sungyoung Yun, Suwon-si (KR); Kyung Bae Park, Suwon-si (KR); Feifei Fang, Suwon-si (KR); Hwijoung Seo, Suwon-si (KR); Hiromasa Shibuya, Suwon-si (KR); Younhee Lim, Suwon-si (KR); Tae Jin Choi, Suwon-si (KR); Chul Joon Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 486 days.

(21) Appl. No.: 18/052,719

(22) Filed: Nov. 4, 2022

(65) Prior Publication Data
US 2024/0040810 A1 Feb. 1, 2024

(30) Foreign Application Priority Data
May 31, 2022 (KR) .................. 10-2022-0067204

(51) Int. Cl.
*H10K 39/34* (2023.01)
*H10K 85/30* (2023.01)
(Continued)

(52) U.S. Cl.
CPC .......... *H10K 39/34* (2023.02); *H10K 85/322* (2023.02); *H10K 85/40* (2023.02); *H10K 85/6572* (2023.02); *G06V 40/1318* (2022.01)

(58) Field of Classification Search
CPC ...... H10K 39/34; H10K 85/322; H10K 85/40; H10K 85/6572; H10K 2101/30;
(Continued)

(56) References Cited

U.S. PATENT DOCUMENTS 8,946,699 B2 * 2/2015 Hatano ............ G02F 1/133514
257/E31.026
10,374,015 B2 8/2019 Hasegawa et al.
(Continued)

FOREIGN PATENT DOCUMENTS

JP 2020-136617 A 8/2020
KR 2018-0013864 A 2/2018
(Continued)

OTHER PUBLICATIONS

Extended European Search Report dated Oct. 30, 2023 for corresponding European Application No. 23169522.2.

*Primary Examiner* — Ermias T Woldegeorgis
(74) *Attorney, Agent, or Firm* — Harness, Dickey & Pierce, P.L.C.

(57) ABSTRACT

A sensor-embedded display panel includes a light emitting element on a substrate and including a light emitting layer, and a photosensor including a photosensitive layer on the substrate and arranged in parallel with the light emitting layer along an in-plane direction of the substrate such that the photosensor and the light emitting layer at least partially overlap in the in-plane direction, wherein the light emitting element and the photosensor further include separate, respective portions of a first common auxiliary layer disposed under each of the light emitting layer and the photosensitive layer and connected to each other to be a single piece of material extending continuously between the light emitting element and the photosensor, and the photosensitive layer includes a first semiconductor represented by Chemical Formula 1 and a second semiconductor not including any fullerenes and forming a pn junction with the first semiconductor.

20 Claims, 4 Drawing Sheets

(51) Int. Cl.
  *H10K 85/40*  (2023.01)
  *H10K 85/60*  (2023.01)
  *G06V 40/13*  (2022.01)

(58) Field of Classification Search
  CPC .... H10K 59/60; H10K 59/35; H10K 59/8051;
    H10K 59/8052; H10K 65/00; G06V
    40/1318
  See application file for complete search history.

(56)  References Cited

U.S. PATENT DOCUMENTS

| | | |
|---|---|---|
| 10,978,523 B2 | 4/2021 | Park et al. |
| 11,056,539 B2 | 7/2021 | Hasegawa et al. |
| 2010/0134735 A1* | 6/2010 | Nakamura .......... H10F 30/2235 |
| | | 257/53 |
| 2016/0351834 A1* | 12/2016 | Bender ................ H10K 50/13 |
| 2017/0141312 A1* | 5/2017 | Enoki .................... H10D 86/85 |
| 2020/0235317 A1 | 7/2020 | Bender et al. |
| 2021/0257420 A1 | 8/2021 | Park et al. |
| 2021/0320149 A1 | 10/2021 | Hasegawa et al. |
| 2021/0327979 A1 | 10/2021 | Kamada et al. |

FOREIGN PATENT DOCUMENTS

| | | |
|---|---|---|
| KR | 2020-0040196 A | 4/2020 |
| KR | 2020-0057756 A | 5/2020 |

* cited by examiner

[FIG. 1]
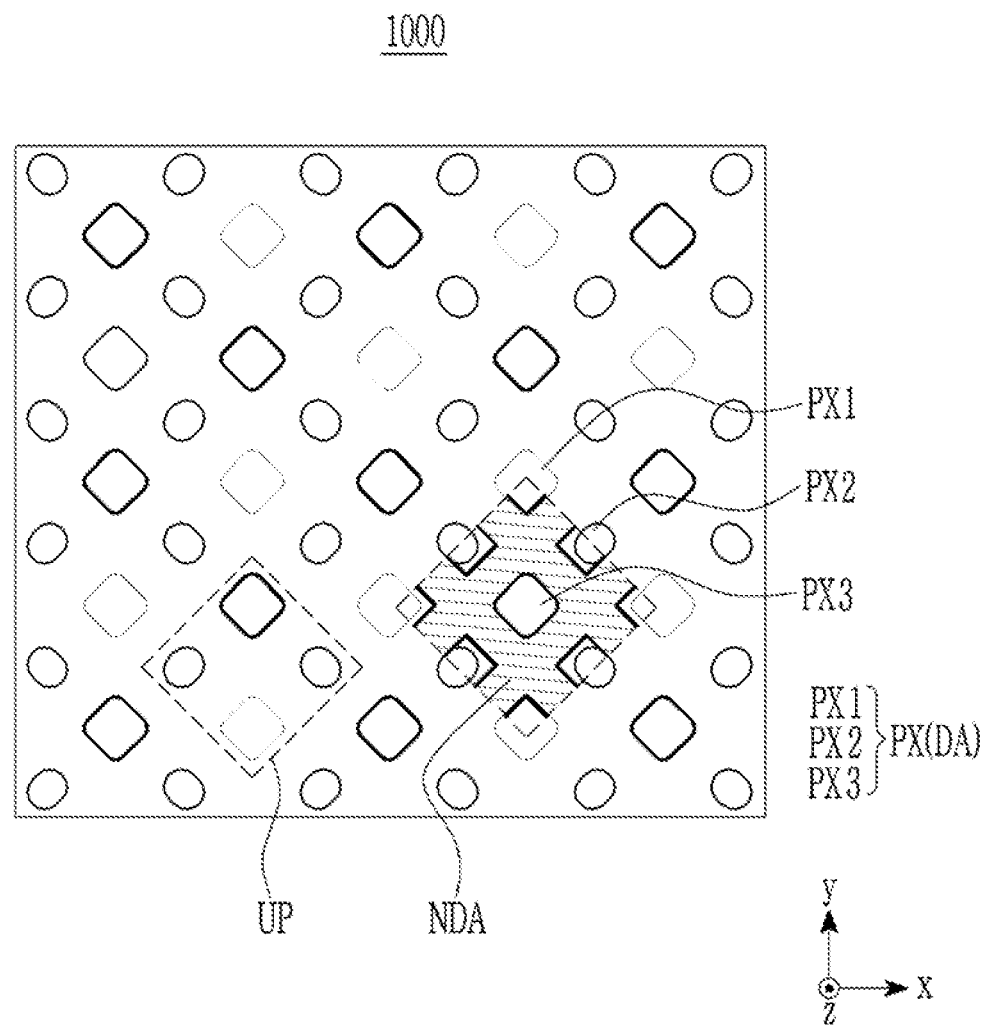

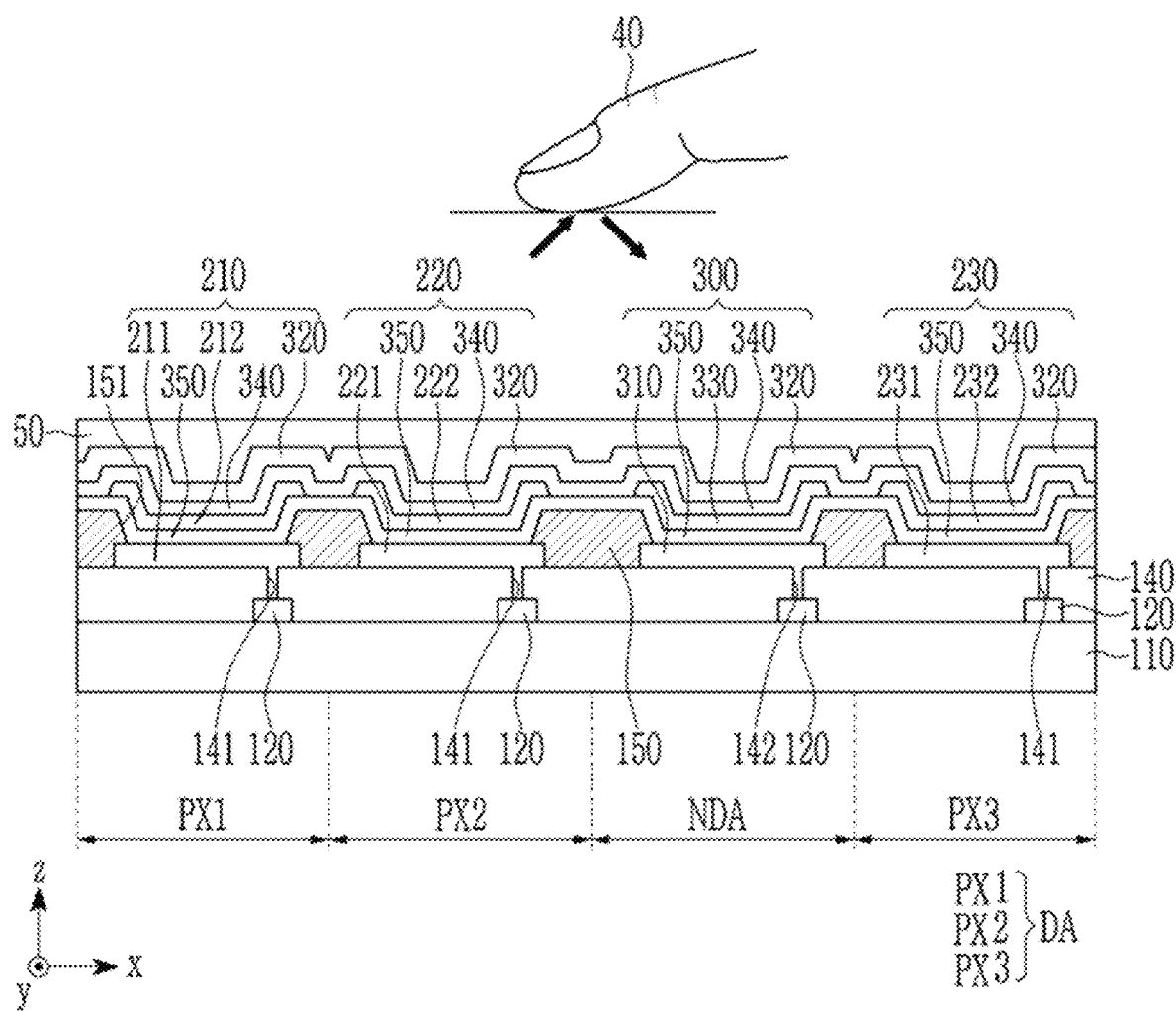

[FIG. 3]
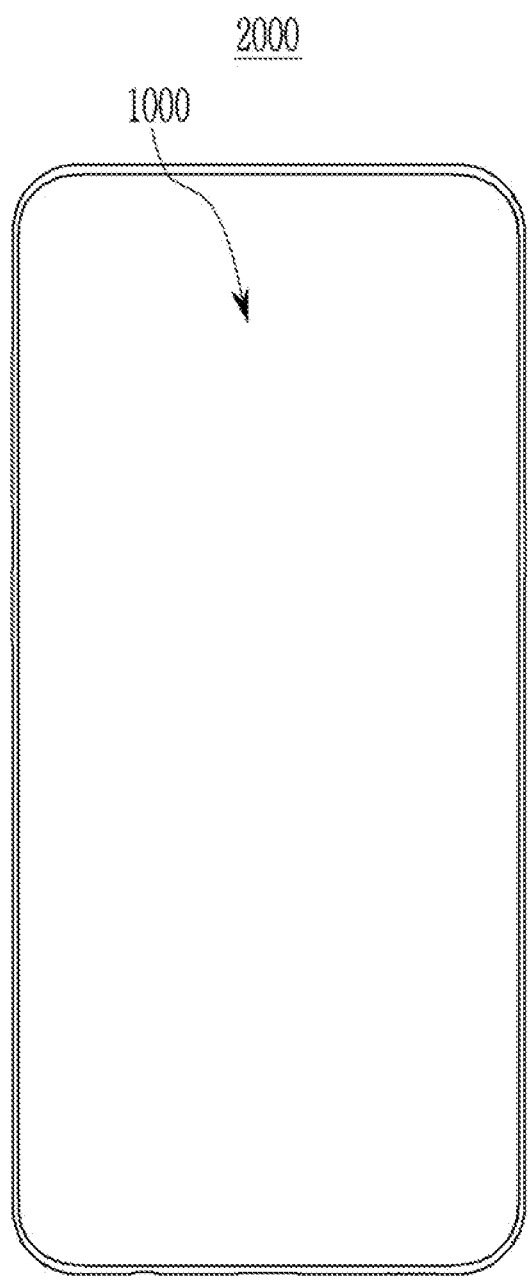

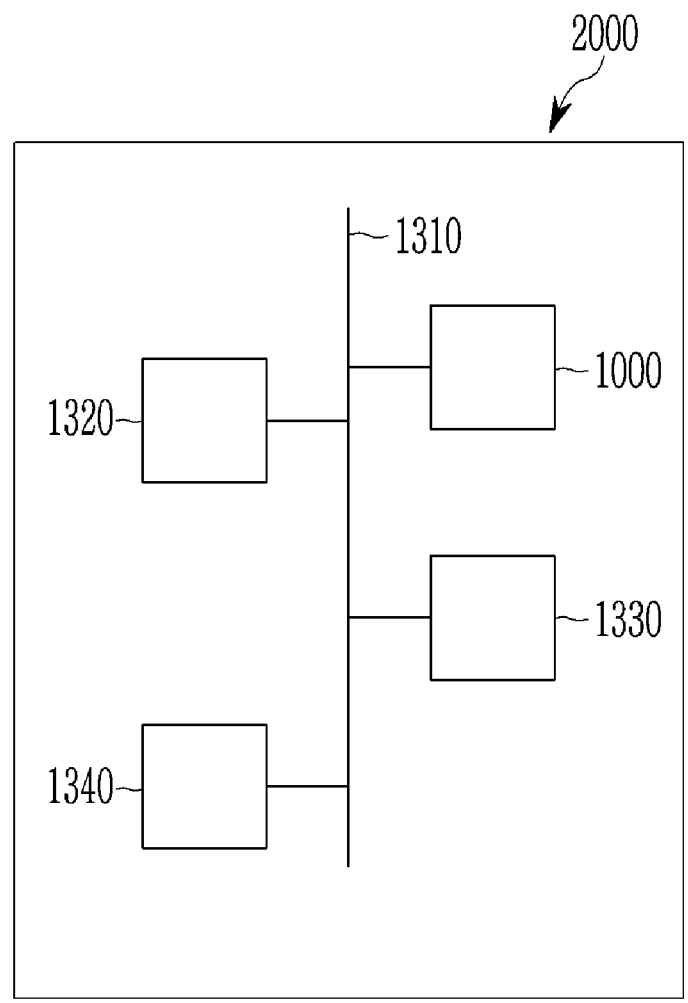
[FIG. 4]

SENSOR EMBEDDED DISPLAY PANEL AND ELECTRONIC DEVICE

CROSS-REFERENCE TO RELATED APPLICATION

This application claims priority to and the benefit of Korean Patent Application No. 10-2022-0067204 filed in the Korean Intellectual Property Office on May 31, 2022, the entire contents of which are incorporated herein by reference.

BACKGROUND

1. Field

Inventive concepts relate to sensor-embedded display panels and electronic devices.

2. Description of the Related Art

Recently, there is an increasing demand for a display device implementing a biometric recognition technology that authenticates the person by extracting specific biometric information or behavioral characteristic information of a person with an automated device centering on finance, healthcare, and mobile. Accordingly, the display device may include a sensor for biometric recognition.

SUMMARY

Such a sensor for biometric recognition may be divided into an electrostatic type, an ultrasonic type, or an optical type. Among them, the optical type sensor is a sensor configured to absorb light and convert the absorbed light into an electrical signal. Meanwhile, the organic material has a large extinction coefficient and may be configured to selectively absorb light in a specific wavelength spectrum according to a molecular structure, and thus it may be usefully applied to an optical type sensor.

On the other hand, the sensor provided in the display device may be disposed under the display panel or may be manufactured as a separate module and mounted on the outside of the display panel. However, when the sensor is disposed under the display panel, the object should be recognized through the display panel, various films, and/or parts, and thus performance may be degraded. When the sensor is manufactured and mounted as a separate module, there are limitations in terms of design and usability. Accordingly, an embedded sensor including a sensor embedded in the display panel may be proposed. However, since the performance and physical properties required for the display panel and the sensor are different from each other, it may be difficult to implement in an integrated form.

Some example embodiments provide a sensor-embedded display panel including a sensor capable of improving performance by being integrated with the display panel.

Some example embodiments provide an electronic device including the sensor-embedded display panel.

According to some example embodiments, a sensor-embedded display panel may include a light emitting element disposed on a substrate and including a light emitting layer, and a photosensor disposed on the substrate and including a photosensitive layer, the photosensitive layer being arranged in parallel with the light emitting layer along an in-plane direction of the substrate such that the photosensor and the light emitting layer at least partially overlap in the in-plane direction, wherein the light emitting element and the photosensor further include separate, respective portions of a first common auxiliary layer under each of the light emitting layer and the photosensitive layer and connected to each other to be a single piece of material extending continuously between the light emitting element and the photosensor, and the photosensitive layer includes a first semiconductor represented by Chemical Formula 1 and a second semiconductor forming a pn junction with the first semiconductor, the second semiconductor not including any fullerenes.

[Chemical Formula 1]

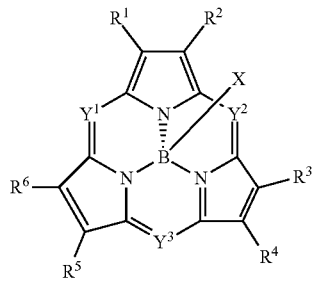

In Chemical Formula 1,

X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, $Y^1$ is N or $CR^{101}$,
$Y^2$ is N or $CR^{102}$,
$Y^3$ is N or $CR^{103}$, $R^1$ to $R^6$ and $R^{101}$ to $R^{103}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof, and $R^1$ to $R^6$ and $R^{101}$ to $R^{103}$ are each independently present, or adjacent two of $R^1$ to $R^6$ and $R^{101}$ to $R^{103}$ are linked to each other to form a ring.

At least one of $R^1$ and $R^2$, $R^3$ and $R^4$, or $R^5$ and $R^6$ may be linked to each other to form a substituted or unsubstituted phenylene group, a substituted or unsubstituted naphthylene group, a substituted or unsubstituted nitrogen-containing divalent ring group, or any combination thereof.

The first semiconductor may be represented by Chemical Formula 1-1 or 1-2.

[Chemical Formula 1-1]

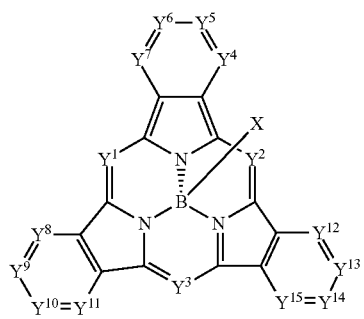

[Chemical Formula 1-2]

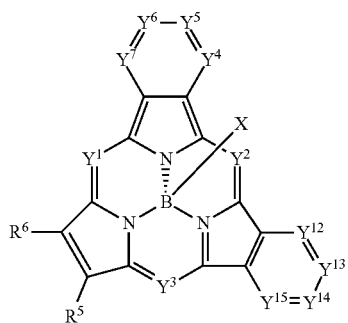

In Chemical Formula 1-1 or 1-2,

X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, $Y^1$ is N or $CR^{101}$,
$Y^2$ is N or $CR^{102}$,
$Y^3$ is N or $CR^{103}$,
$Y^4$ is N or $CR^{104}$,
$Y^5$ is N or $CR^{105}$,
$Y^6$ is N or $CR^{106}$,
$Y^7$ is N or $CR^{107}$,
$Y^8$ is N or $CR^{198}$,
$Y^9$ is N or $CR^{109}$,
$Y^{10}$ is N or $CR^{110}$,
$Y^{11}$ is N or $CR^{111}$,
$Y^{12}$ is N or $CR^{112}$,
$Y^{13}$ is N or $CR^{113}$,
$Y^{14}$ is N or $CR^{114}$,
$Y^{15}$ is N or $CR^{115}$, and $R^5$, $R^6$, and $R^{101}$ to $R^{115}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof.

The first semiconductor may be represented by one of Chemical Formulas 1A to 1D.

[Chemical Formula 1A]

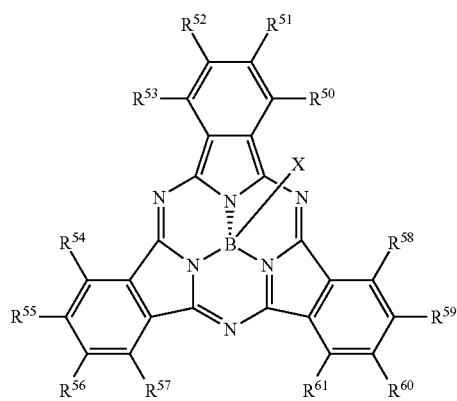

[Chemical Formula 1B]

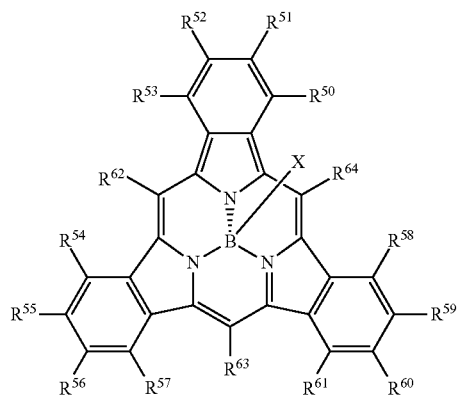

[Chemical Formula 1C]

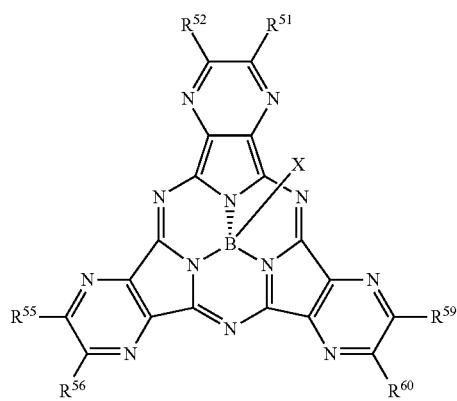

[Chemical Formula 1D]

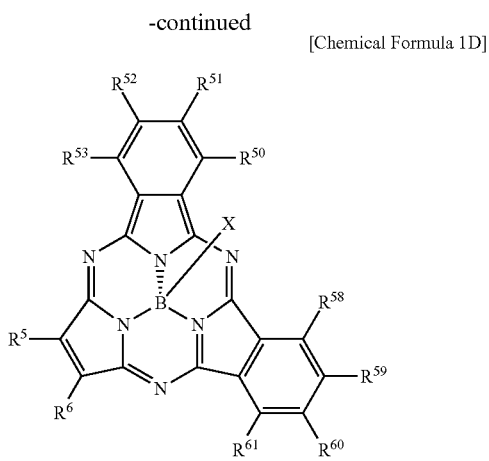

In Chemical Formulas 1A to 1D,

X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, and $R^5$, $R^6$, and $R^{50}$ to $R^{64}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof.

A difference between a sublimation temperature of the first semiconductor and a sublimation temperature of the second semiconductor may be greater than or equal to about 0° C. and less than about 150° C., wherein each sublimation temperature may be a temperature at which a weight loss of 10% relative to an initial weight occurs during thermogravimetric analysis at 10 Pa or less.

The sublimation temperature of the first semiconductor may be about 100° C. to about 300° C., and the sublimation temperature of the second semiconductor may be about 100° C. to about 350° C.

The light emitting layer may include an organic light emitting material, and a difference between any two of the sublimation temperature of the first semiconductor, the sublimation temperature of the second semiconductor, and a sublimation temperature of the organic light emitting material may be greater than or equal to about 0° C. and less than about 150° C.

A difference between a Highest Occupied Molecular Orbital (HOMO) energy level of the first semiconductor and a HOMO energy level of the first common auxiliary layer may be greater than or equal to about 0 eV and less than about 1.0 eV.

The second semiconductor may be a transparent semiconductor that does not substantially absorb light in a visible wavelength spectrum.

The sensor-embedded display panel may further include a common electrode configured to apply a common (e.g., same) voltage to the light emitting element and the photosensor.

The light emitting element and the photosensor may further include separate, respective portions of a second common auxiliary layer between the common electrode and the light emitting layer and between the common electrode and the photosensitive layer and connected to each other to be a single piece of material extending continuously between the light emitting element and the photosensor.

A difference between a Lowest Unoccupied Molecular Orbital (LUMO) energy level of the second semiconductor and a LUMO energy level of the second common auxiliary layer may be greater than or equal to about 0 eV and less than about 1.0 eV.

The light emitting element may include first, second, and third light emitting elements configured to emit light of different wavelength spectra from each other, and the photosensor may be configured to absorb light emitted from at least one of the first, second, or third light emitting elements and then reflected by a recognition target and to convert it into an electrical signal.

The sensor-embedded display panel may include a display area configured to display one or more colors and a non-display area excluding the display area, wherein the light emitting element is in the display area and the photosensor is in the non-display area.

The light emitting element may include a first light emitting element configured to emit light of a red wavelength spectrum, a second light emitting element configured to emit light of a green wavelength spectrum, and a third light emitting element configured to emit light of a blue wavelength spectrum, the display area may include a plurality of first subpixels configured to display light of the red wavelength spectrum and including the first light emitting element, a plurality of second subpixels configured to display light of the green wavelength spectrum and including the second light emitting element, and a plurality of third subpixels configured to display light of the blue wavelength spectrum and including the third light emitting element, and the photosensor may be between at least two subpixels of a first subpixel of the plurality of first subpixels, a second subpixel of the plurality of second subpixels, or a third subpixel of the plurality of third subpixels.

According to some example embodiments, a sensor-embedded display panel includes a display area configured to display a color and a non-display area excluding the display area, wherein the display area includes a first subpixel configured to display a first color and including a first light emitting element, a second subpixel configured to display a second color and including a second light emitting element, and a third subpixel configured to display a third color and including a third light emitting element, the non-display area includes a photosensor between at least two of the first subpixel, the second subpixel, or the third subpixel, the first light emitting element includes a first light emitting layer configured to emit light of an emission spectrum corresponding to the first color, the second light emitting element includes a second light emitting layer configured to emit light of an emission spectrum corresponding to the second color, the third light emitting element includes a third light emitting layer configured to emit light of an emission spectrum corresponding to the third color, the photosensor includes a photosensitive layer configured to absorb light emitted from at least one of the first, second, or third light emitting elements and then reflected by a recognition target and to convert it into an electrical signal, and the photosensitive layer includes a first semiconductor represented by Chemical Formula 1.

The first, second, and third light emitting elements and the photosensor may be arranged in parallel along an in-plane direction of the substrate such that the first, second, and third light emitting elements and the photosensor at least partially overlap in the in-plane direction.

The first, second, and third light emitting elements and the photosensor may further include separate, respective pixel electrodes separately in the first, second and third light emitting elements and the photosensor, separate, respective portions of configured to apply a common voltage to the first, second and third light emitting elements and the photosensor, separate, respective portions of a first common auxiliary layer between the pixel electrodes of the first, second, and third light emitting elements and the first, second, and third light emitting layers and between the pixel electrode of the photosensor and the photosensitive layer, respectively, and connected to each other as a single piece of material extending continuously between the first, second, and third light emitting elements and the photosensor, and separate, respective portions of a second common auxiliary layer between the common electrode and the first, second, and third light emitting layers and between the common electrode and the photosensitive layer, respectively and connected to each other as a single piece of material extending continuously between the first, second, and third light emitting elements and the photosensor.

The photosensitive layer may further include a second semiconductor forming a pn junction with the first semiconductor, the first semiconductor may be a light absorbing material having a peak absorption wavelength in a wavelength spectrum of about 500 nm to about 600 nm, and the second semiconductor may be a transparent semiconductor that is configured to not substantially absorb light in a visible wavelength spectrum.

According to some example embodiments, an electronic device including the sensor-embedded display panel is provided.

A sensor with improved optical and electrical performance and process stability may be integrated into the display panel, thereby realizing a high-performance sensor while improving design and usability.

BRIEF DESCRIPTION OF THE DRAWINGS

FIG. 1 is a plan view showing an example of a sensor-embedded display panel according to some example embodiments, FIG. 2 is a cross-sectional view illustrating an example of a sensor-embedded display panel according to some example embodiments, FIG. 3 is a schematic view illustrating an example of a smart phone as an electronic device according to some example embodiments, and FIG. 4 is a schematic view illustrating an example of a configuration diagram of an electronic device according to some example embodiments.

DETAILED DESCRIPTION

Hereinafter, example embodiments will be described in detail so that a person skilled in the art would understand the same. However, a structure that is actually applied may be implemented in various different forms and is not limited to the embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or any combination thereof.

As used herein, when a definition is not otherwise provided, "hetero" refers to one including 1 to 4 heteroatoms selected from N, O, S, Se, Te, Si, and P.

Hereinafter, when a definition is not otherwise provided, the energy level is the highest occupied molecular orbital (HOMO) energy level or the lowest unoccupied molecular orbital (LUMO) energy level.

It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "identical" to, "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the inventive concepts.

Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining an energy bandgap using a UV-Vis spectrometer (Shimadzu Corporation), and then calculating the LUMO energy level from the energy bandgap and the already measured HOMO energy level.

Hereinafter, a sensor-embedded display panel according to some example embodiments is described.

The sensor-embedded display panel according to some example embodiments may be a display panel capable of performing a display function and a recognition function (e.g., biometric recognition function), and may be an in-cell type display panel in which a sensor performing a recognition function (e.g., biometric recognition function) is embedded in the display panel.

FIG. 1 is a plan view showing an example of a sensor-embedded display panel according to some example embodiments and FIG. 2 is a cross-sectional view illustrating an example of a sensor-embedded display panel according to some example embodiments.

Referring to FIGS. 1 and 2, a sensor-embedded display panel 1000 according to some example embodiments includes a plurality of subpixels PXs displaying different colors. The plurality of subpixels PXs may be configured to display at least three primary colors, for example, a first subpixel PX1, a second subpixel PX2, and a third subpixel PX3 displaying different first color, second color, and third color selected from red, green, and blue. For example, the first color, the second color, and the third color may be red, green, and blue, respectively. The first subpixel PX1 may be a red subpixel configured to display red, the second subpixel PX2 may be a green subpixel configured to display green, and the third subpixel PX3 may be a blue subpixel configured to display blue. However, the present inventive concepts are not limited thereto, and an auxiliary subpixel (not shown) such as a white subpixel may be further included. Displaying a color may refer to emitting light corresponding to the color (e.g., light in a wavelength spectrum of the color). Referring to FIG. 1, the sensor-embedded display panel 1000 may include a plurality of first subpixels PX1 configured to display a red color (e.g., light of a red wavelength spectrum) and including a first light emitting element (e.g., the first light emitting element 210 shown in FIG. 2), a plurality of second subpixels PX2 configured to display a green color (e.g., light of a green wavelength spectrum) and including a second light emitting element (e.g., the second light emitting element 220 shown in FIG. 2), and a plurality of third subpixels PX3 configured to display a blue color (e.g., light of a blue wavelength spectrum) and including a third light emitting element (e.g., the third light emitting element 230 shown in FIG. 2), where the first subpixels PX1, the second subpixels PX2, and the third subpixels PX3 are located in and/or at least partially define the display area (DA).

The plurality of subpixels PXs including the first subpixel PX1, the second subpixel PX2, and the third subpixel PX3 may constitute (e.g., define) one unit pixel UP to be arranged repeatedly along the row and/or column. In FIG. 1, a structure including one first subpixel PX1, two second subpixels PX2, and one third subpixel PX3 in the unit pixel UP is illustrated, but the present inventive concepts are not limited thereto. At least one first subpixel PX1, at least one second subpixel PX2, and at least one third subpixel PX3 may be included in the unit pixel UP. In the drawing, as an example, an arrangement of a Pentile type is illustrated, but the present inventive concepts are not limited thereto. The subpixels PXs may be arranged variously. An area occupied by the plurality of subpixels PXs and displaying colors by the plurality of subpixels PXs may be a display area DA configured to display an image. For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000 that excludes the display area (DA) (e.g., portions of the area of the sensor-embedded display panel 1000 that are between adjacent subpixels (PX) in the xy direction, xy plane, etc.) may be a non-display area (NDA) that is configured to not display an image thereon (e.g., configured to not display any color).

Each of the first subpixel PX1, the second subpixel PX2, and the third subpixel PX3 may include a light emitting element. As an example, the first subpixel PX1 may include a first light emitting element 210 configured to emit light of a wavelength spectrum of a first color, the second subpixel PX2 may include a second light emitting element 220 configured to emit light of a wavelength spectrum of a second color, and the third subpixel PX3 may include a third light emitting element 230 configured to emit light of a wavelength spectrum of a third color. However, the present inventive concepts are not limited thereto, and at least one of the first subpixel PX1, the second subpixel PX2, or the third subpixel PX3 may include a light emitting element configured to emit light of a combination of a first color, a second color, and a third color, that is, light in a white wavelength spectrum, and may display a first color, a second color, or a third color through a color filter (not shown). Herein, the terms "wavelength spectrum" and "wavelength region" may be used interchangeably.

The sensor-embedded display panel 1000 according to some example embodiments includes a photosensor 300. The photosensor 300 may be disposed in a non-display area NDA. The non-display area NDA may be an area other than the display area DA, in which the first subpixel PX1, the second subpixel PX2, the third subpixel PX3, and optionally auxiliary subpixels are not disposed (e.g., a portion of the total area of the sensor-embedded display panel 1000 that excludes the display area (DA), excludes the subpixels (PX), is between adjacent subpixels (PX), etc.). For example, the area (e.g., in the xy plane) of the subpixels (PX) may collectively define the display area (DA) that is configured to display an image thereon (e.g., configured to display one or more colors). A portion of the area (e.g., in the xy plane) of the sensor-embedded display panel 1000 that excludes the display area (DA) (e.g., portions of the area of the sensor-embedded display panel 1000 that are between adjacent subpixels (PX) in the xy direction, xy plane, etc.) may be a non-display area (NDA) that is configured to not display an image thereon (e.g., configured to not display any color). The photosensor 300 may be disposed between at least two subpixels selected from the first subpixel PX1, the second subpixel PX2, and the third subpixel PX3 (e.g., between at least two subpixels of a first subpixel PX1 of a plurality of first subpixels PX1, a second subpixel PX2 of the plurality of second subpixels PX2, or a third subpixel PX3 of the plurality of third subpixels PX3), and may be disposed in parallel with the first, second, and third light emitting elements 210, 220, and 230 in the display area DA for example in parallel along the in-plane direction of the substrate 110 (e.g., the xy direction as shown), which may be a direction extending parallel to an upper surface of the substrate 110.

The photosensor 300 may be an optical type recognition sensor (e.g., a biometric sensor), and may be configured to absorb light emitted from at least one of the first, second or third light emitting elements 210, 220, or 230 in the display area DA and then reflected by a recognition target 40 such as a living body, a tool, or an object (e.g., may be configured to absorb light of a red wavelength spectrum, a green wavelength spectrum, a blue wavelength spectrum, an infrared wavelength spectrum, or any combination thereof) to convert the absorbed light into an electrical signal. Herein, the living body may be a finger, a fingerprint, a palm, an iris, a face, and/or a wrist, but is not limited thereto. The photosensor 300 may be, for example, a fingerprint sensor, an illumination sensor, an iris sensor, a distance sensor, a blood vessel distribution sensor, and/or a heart rate sensor, but is not limited thereto.

The photosensor 300 may be in the same plane as the first, second, and third light emitting elements 210, 220, and 230 on the substrate 110, and may be embedded in the sensor-embedded display panel 1000. Restated, the photosensor 300 may be in parallel with the first, second, and third light emitting elements 210, 220, and 230 on the substrate 110 along an in-plane direction of the substrate 110. As described herein, the in-plane direction of the substrate 110 may be a direction (e.g., the xy direction as shown) that extends in parallel with at least a portion of the substrate 110, including an upper surface of the substrate 110.

Referring to FIG. 2, the sensor-embedded display panel 1000 includes a substrate 110; a thin film transistor 120 on the substrate 110; an insulation layer 140 on the thin film transistor 120; a pixel definition layer 150 on the insulation layer 140; and first, second, or third light emitting elements 210, 220, and 230 and the photosensor 300 in a space partitioned by the pixel definition layer 150.

The substrate 110 may be a light-transmitting substrate, for example, a glass substrate or a polymer substrate. The polymer substrate may include, for example, polycarbonate, polymethylmethacrylate, polyethyleneterephthalate, polyethylenenaphthalate, polyimide, polyamide, polyamideimide, polyethersulfone, polyorganosiloxane, styrene-ethylene-butylene-styrene, polyurethane, polyacrylate, polyolefin, or any combination thereof, but is not limited thereto.

A plurality of thin film transistors 120 are formed on the substrate 110. One or more thin film transistor 120 may be included in each subpixel PX, and may include, for example, at least one switching thin film transistor and/or at least one driving thin film transistor. The substrate 110 on which the thin film transistor 120 is formed may be referred to as a thin film transistor substrate (TFT substrate) or a thin film transistor backplane (TFT backplane).

The insulation layer 140 may cover the substrate 110 and the thin film transistor 120 and may be formed on the whole surface of the substrate 110. The insulation layer 140 may be a planarization layer or a passivation layer, and may include an organic insulating material, an inorganic insulating material, an organic-inorganic insulating material, or any combination thereof. The insulation layer 140 may have a plurality of contact holes 141 for connecting the first, second, and third light emitting elements 210, 220, and 230 and the thin film transistor 120 and a plurality of contact holes 142 for electrically connecting the photosensor 300 and the thin film transistor 120. The insulation layer 140 may include an organic, inorganic, or organic-inorganic insulating material, in some example embodiments, an inorganic insulating material such as silicon oxide, silicon nitride, silicon oxynitride, aluminum oxide, aluminum nitride, or aluminum oxynitride; an organic insulating material such as polyimide, polyamide, polyamideimide, or polyacrylate; or an organic-inorganic insulating material such as polyorganosiloxane or polyorganosilazane.

The pixel definition layer 150 may also be formed on the whole surface of the substrate 110 and may be disposed between adjacent subpixels PXs to partition each subpixel PX. The pixel definition layer 150 may have a plurality of openings 151 disposed in each subpixel PX, and in each opening 151, any one of first, second, or third light emitting elements 210, 220, or 230 or the photosensor 300 may be disposed. The pixel definition layer 150 may include an insulation layer that may include an organic, inorganic, or organic-inorganic insulating material, in some example embodiments, an inorganic insulating material such as silicon oxide, silicon nitride, or silicon oxynitride; an organic insulating material such as polyimide; or an organic-inorganic insulating material such as polyorganosiloxane or polyorganosilazane.

The first, second and third light emitting elements 210, 220, and 230 are formed on the substrate 110 (or thin film transistor substrate), and are repeatedly arranged along the in-plane direction (e.g., xy direction) of the substrate 110 (also referred to as an in-plane direction of the substrate 110). As described above, the first, second, and third light emitting elements 210, 220, and 230 may be included in the first subpixel PX1, the second subpixel PX2, and the third subpixel PX3, respectively. The first, second, and third light emitting elements 210, 220, and 230 may be electrically connected to separate thin film transistors 120 and may be driven independently.

The first, second, and third light emitting elements 210, 220, and 230 may be configured to each independently emit one light of a red wavelength spectrum, a green wavelength spectrum, a blue wavelength spectrum, an infrared wavelength spectrum, or any combination thereof. For example, the first light emitting element 210 may be configured to emit light of a red wavelength spectrum, the second light emitting element 220 may be configured to emit light of a green wavelength spectrum, and the third light emitting element 230 may be configured to emit light of a blue wavelength spectrum. Herein, the red wavelength spectrum, the green wavelength spectrum, and the blue wavelength spectrum may have a maximum emission wavelength ($\lambda_{peak, L}$) in a wavelength spectrum of greater than about 600 nm and less than about 750 nm, about 500 nm to about 600 nm, and greater than or equal to about 400 nm and less than about 500 nm, respectively.

The first, second, and third light emitting elements 210, 220, and 230 may be, for example, light emitting diodes, for example organic light emitting diodes (OLEDs) including an organic light emitting material.

The photosensor 300 may be formed on the substrate 110 (or the thin film transistor substrate), and may be randomly or regularly arranged along the in-plane direction (e.g., xy direction) of the substrate 110. As described above, the photosensor 300 may be disposed in the non-display area NDA, and may be connected to a separate thin film transistor 120 to be independently driven. The photosensor 300 may be configured to absorb light belonging to a wavelength spectrum of the light emitted from at least one of the first, second, or third light emitting elements 210, 220, or 230 and then convert the absorbed light into an electrical signal. For example, the photosensor 300 may be configured to absorb light of a red wavelength spectrum, a green wavelength spectrum, a blue wavelength spectrum, an infrared wavelength spectrum, or any combination thereof, and then convert the absorbed light into an electrical signal, and for example, light of a green wavelength spectrum may be absorbed and converted into an electrical signal. The photosensor 300 may be, for example, a photoelectric conversion diode, for example an organic photoelectric conversion diode including an organic photoelectric conversion material.

Each of the first, second, and third light emitting elements 210, 220, and 230 and the photosensor 300 may include a separate, respective pixel electrode 211, 221, 231, and 310; a separate portion of a common electrode 320 facing the pixel electrodes 211, 221, 231, and 310 and to which a common voltage is applied; and a separate, respective one of the light emitting layers 212, 222, and 232 or a photosensitive layer 330, a separate portion of a first common auxiliary layer 350, and a separate portion of a second common auxiliary layer 340 between the pixel electrode 211, 221, 231, and 310 and the common electrode 320.

The first, second, and third light emitting elements 210, 220, and 230 and the photosensor 300 may be arranged in parallel along the in-plane direction (e.g., xy direction) of the substrate 110, and may share the common electrode 320, the first common auxiliary layer 350, and the second common auxiliary layer 340 which are formed on the whole surface of the substrate 110. For example, as shown in at least FIG. 2, the photosensitive layer 330 of the photosensor 300 and the light emitting layers 212, 222, and 232 of the first, second, and third light emitting elements 210, 220, and 230 may at least partially overlap with each other (e.g., partially or completely overlap each other) in the in-plane direction (e.g., xy direction) of the substrate 110, which may be understood to be a horizontal direction that extends in parallel to an in-plane direction of the substrate 110 as shown in FIG. 2 and/or a horizontal direction that extends in parallel to an upper surface of the substrate 110 as shown in FIG. 2, and the photosensitive layer 330 and the light emitting layers 212, 222, and 232 may be at least partially positioned on the same plane (e.g., an xy plane extending in the xy directions that intersects each of the photosensitive layer 330 and the light emitting layers 212, 222, and 232).

The common electrode 320 is continuously formed as a single piece of material that extends on the light emitting layers 212, 222, and 232 and the photosensitive layer 330, and is substantially formed on the whole surface of the substrate 110. The common electrode 320 may apply a common voltage (e.g., a same voltage) to the first, second, and third light emitting elements 210, 220, and 230 and the photosensor 300. As shown, the first, second, and third light emitting elements 210, 220, and 230 and the photosensor 300 may include separate portions of a single common electrode 320 that is a single piece of material that extends on each of the respective light emitting layers 212, 222, and 232 and the photosensitive layer 330 and between the first, second, and third light emitting elements 210, 220, and 230 and the photosensor 300.

The common electrode 320 may be a light-transmitting electrode configured to transmit light. The light-transmitting electrode may be a transparent electrode or a semi-transmissive electrode. The transparent electrode may have a light transmittance of about 85% to about 100%, about 90% to about 100%, or about 95% to about 100% and the semi-transmissive electrode may have a light transmittance of greater than or equal to about 30% and less than about 85%, about 40% to about 80%, or about 40% to about 75%. The transparent electrode and the semi-transmissive electrode may include, for example, at least one of an oxide conductor, a carbon conductor, or a metal thin film. The oxide conductors may include, for example, one or more of indium tin oxide (ITO), indium zinc oxide (IZO), zinc tin oxide (ZTO), aluminum tin oxide (ATO), and aluminum zinc oxide (AZO), the carbon conductor may include one or more selected from graphene and carbon nanostructures, and the metal thin film may be a very thin film including aluminum (Al), magnesium (Mg), silver (Ag), gold (Au), magnesium-silver (Mg—Ag), magnesium-aluminum (Mg—Al), an alloy thereof, or any combination thereof.

The first common auxiliary layer 350 may be between the light emitting layers 212, 222, and 232 and the photosensitive layer 330 and the substrate 110, and among them, between the light emitting layers 212, 222, and 232 and the photosensitive layer 330 and the pixel electrodes 211, 221, 231, and 310. The first common auxiliary layer 350 may continuously be formed as a single piece of material that extends continuously under the light emitting layers 212, 222, and 232 and the photosensitive layer 330 and on the pixel electrodes 211, 221, 231, and 310. As shown, the first, second, and third light emitting elements 210, 220, and 230 and the photosensor 300 may include separate portions of a single first common auxiliary layer 350 that is a single piece of material that extends under each of the respective light emitting layers 212, 222, and 232 and the photosensitive layer 330 and between the first, second, and third light emitting elements 210, 220, and 230 and the photosensor 300.

The first common auxiliary layer 350 may be a charge auxiliary layer (e.g., hole auxiliary layer) that facilitates injection and/or movement of charge carriers (e.g., holes) from the pixel electrodes 211, 221, and 231 to the light emitting layers 212, 222, and 232. For example, the HOMO energy level of the first common auxiliary layer 350 may be between the HOMO energy level of the light emitting layers 212, 222, and 232 and the work function of the pixel electrodes 211, 221, and 231. The work function of the pixel electrodes 211, 221, and 231, the HOMO energy level of the first common auxiliary layer 350, and the HOMO energy level of the light emitting layers 212, 222, and 232 may become sequentially deep.

The first common auxiliary layer 350 may include an organic material, an inorganic material, an organic-inorganic material, or any combination thereof satisfying the HOMO energy level, for example a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-[tris(3-methylphenyl)phenylamino]triphenylamine), TDATA (4,4'4"-tris(N,N-diphenylamino)triphenylamine), 2-TNATA (4,4',4"-tris{N,N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h] quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl)triphenylamine), NPB (N,N'-di(naphthalene-1-yl)-N,N'-diphenyl-benzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto. The first common auxiliary layer 350 may be one layer or two or more layers.

The second common auxiliary layer 340 may be between the light emitting layers 212, 222, and 232 and the photosensitive layer 330 and the common electrode 320, and the light emitting layers 212, 222, and 232 may be continuously formed as a single piece of material that extends on the photosensitive layer 330 and under the common electrode 320. As shown, the first, second, and third light emitting elements 210, 220, and 230 and the photosensor 300 may include separate portions of a single second common auxiliary layer 340 that is a single piece of material that extends on each of the respective light emitting layers 212, 222, and 232 and the photosensitive layer 330 and between the first, second, and third light emitting elements 210, 220, and 230 and the photosensor 300.

The second common auxiliary layer 340 may be a charge auxiliary layer (e.g., an electron auxiliary layer) that facilitates injection and/or movement of charges (e.g., electrons) from the common electrode 320 to the light emitting layers 212, 222, and 232. For example, an LUMO energy level of the second common auxiliary layer 340 may be between an LUMO energy level of the light emitting layers 212, 222, and 232 and a work function of the common electrode 320. The work function of the common electrode 320, the LUMO energy level of the first common auxiliary layer 340, and the LUMO energy level of the light emitting layers 212, 222, and 232 may become shallow in sequence.

The second common auxiliary layer 340 may include an organic material, an inorganic material, an organic-inorganic material, or any combination thereof satisfying the LUMO energy level, for example a halogenated metal such as LiF, NaCl, CsF, RbCl, and RbI; a lanthanides metal such as Yb; a metal oxide such as $Li_2O$ or BaO; Liq (lithium quinolate), Alq3 (tris(8-hydroxyquinolinato)aluminum), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1, O8)-(1,1'-biphenyl-4-olato)aluminum), $Bebq_2$ (beryllium bis (benzoquinolin-10-olate), ADN (9,10-di(naphthalene-2-yl) anthracene), BmPyPhB (1,3-bis[3,5-di(pyridin-3-yl)phenyl] benzene), or any combination thereof, but is not limited thereto. The second common auxiliary layer 340 may be one layer or two or more layers.

Each of the first, second, and third light emitting elements 210, 220, and 230 and the photosensor 300 includes pixel electrodes 211, 221, 231, and 310 facing the common electrode 320. One of the pixel electrodes 211, 221, 231, and 310 or the common electrode 320 is an anode, and the other is a cathode. For example, the pixel electrodes 211, 221, 231, and 310 may be an anode, and the common electrode 320 may be a cathode. The pixel electrodes 211, 221, 231, and 310 are separated for each subpixel PX, and are electrically connected to each separate thin film transistor 120 to be independently driven.

The pixel electrodes 211, 221, 231, and 310 may each be a light-transmitting electrode (a transparent electrode or a semi-transmissive electrode) or a reflective electrode. The light-transmitting electrode is the same as described above.

The reflective electrode may include a reflective layer having a light transmittance of less than or equal to about 5% and/or a reflectance of greater than or equal to about 80%, and the reflective layer may include an optically opaque material. The optically opaque material may include a metal, a metal nitride, or any combination thereof, for example silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto. The reflective electrode may be formed of a reflective layer or may have a stacked structure of a reflective layer/transmissive layer or a transmissive layer/reflective layer/transmissive layer, and the reflective layer may be one layer or two or more layers.

For example, when the pixel electrodes 211, 221, 231, and 310 are reflective electrodes and the common electrode 320 is a light-transmitting electrode, the sensor-embedded display panel 1000 may be a top emission type display panel configured to emit light toward the opposite side of the substrate 110. For example, when the pixel electrodes 211, 221, 231, and 310 and the common electrode 320 are light-transmitting electrodes, respectively, the sensor-embedded display panel 1000 may be a both side emission type display panel configured to emit light toward both the substrate 110 and the opposite side of the substrate 110.

For example, the pixel electrodes 211, 221, 231, and 310 may be reflective electrodes and the common electrode 320 may be a semi-transmissive electrode. In this case, the sensor-embedded display panel 1000 may have a microcavity structure. In the microcavity structure, reflection may occur repeatedly between the reflective electrode and the semi-transmissive electrode separated by a particular (or, alternatively, predetermined) optical length (e.g., a distance between the semi-transmissive electrode and the reflective electrode) and light of a particular (or, alternatively, predetermined) wavelength spectrum may be enhanced to improve optical properties.

For example, among the light emitted from the light emitting layers 212, 222, and 232 of the first, second, and third light emitting elements 210, 220, and 230, light of a particular (or, alternatively, predetermined) wavelength spectrum may be repeatedly reflected between the semi-transmissive electrode and the reflective electrode and then may be modified. Among the modified light, light of a wavelength spectrum corresponding to a resonance wavelength of a microcavity may be enhanced to exhibit amplified light emission characteristics in a narrow wavelength spectrum. Accordingly, the sensor-embedded display panel 1000 may express colors with high color purity.

For example, among the light incident on the photosensor 300, light of a particular (or, alternatively, predetermined) wavelength spectrum may be repeatedly reflected between the semi-transmissive electrode and the reflective electrode to be modified. Among the modified light, light having a wavelength spectrum corresponding to the resonance wavelength of a microcavity may be enhanced to exhibit photoelectric conversion characteristics amplified in a narrow wavelength spectrum. Accordingly, the photosensor 300 may exhibit high photoelectric conversion characteristics in a narrow wavelength spectrum.

Each of the first, second, and third light emitting elements 210, 220, and 230 includes light emitting layers 212, 222, and 232 between the pixel electrodes 211, 221, and 231 and the common electrode 320. Each of the light emitting layer 212 included in the first light emitting element 210, the light emitting layer 222 included in the second light emitting element 220, and the light emitting layer 232 included in the third light emitting element 230 may be configured to emit light in the same or different wavelength spectra and may be configured to emit light in, for example a red wavelength spectrum, a green wavelength spectrum, a blue wavelength spectrum, an infrared wavelength spectrum, or any combination thereof.

For example, when the first light emitting element 210, the second light emitting element 220, and the third light emitting element 230 are a red light emitting elements, a green light emitting element, and a blue light emitting element, respectively, the light emitting layer 212 may be a red light emitting layer configured to emit light in a red wavelength spectrum, the light emitting layer 222 included in the second light emitting element 220 may be a green light emitting layer configured to emit light in a green wavelength spectrum, and the light emitting layer 232 included in the third light emitting element 230 may be a blue light emitting layer configured to emit light in a blue wavelength spectrum. Herein, the red wavelength spectrum, the green wavelength spectrum, and the blue wavelength spectrum may have a peak absorption wavelength of greater than about 600 nm and less than about 750 nm, about 500 nm to about 600 nm, and greater than or equal to about 380 nm and less than about 500 nm, respectively.

For example, when at least one of the first light emitting element 210, the second light emitting element 220, or the third light emitting element 230 is a white light emitting element, the light emitting layer of the white light emitting element may be configured to emit light of a full visible light wavelength spectrum, for example, light in a wavelength spectrum of greater than or equal to about 380 nm and less than about 750 nm, about 400 nm to about 700 nm, or about 420 nm to about 700 nm.

The light emitting layers 212, 222, and 232 may include at least one host material and a fluorescent or phosphorescent dopant, and at least one of the at least one host material and the fluorescent or phosphorescent dopant may be an organic light emitting material. The organic light emitting material may include, for example, a low molecular organic light emitting material, for example, a vapor depositable organic light emitting material.

The organic light emitting material included in the light emitting layers 212, 222, 232 is not particularly limited as long as it is an electroluminescent material capable of emitting light of a particular (or, alternatively, predetermined) wavelength spectrum, and may be, for example, perylene; rubrene; 4-(dicyanomethylene)-2-methyl-6-[p-(dimethylamino)styryl]-4H-pyran; coumarin or a derivative thereof; carbazole or a derivative thereof; TPBi (2,2',2"-(1, 3,5-benzinetriyl)-tris(1-phenyl-1-H-benzimidazole); TBADN (2-t-butyl-9,10-di(naphth-2-yl)anthracene); AND (9,10-di(naphthalene-2-yl)anthracene); CBP (4,4'-bis(N-carbazolyl)-1,1'-biphenyl); TCTA (4,4',4"-tris(carbazol-9-yl)-triphenylamine); TPBi (1,3,5-tris(N-phenylbenzimidazol-2- yl)benzene); TBADN (3-tert-butyl-9,10-di(naphth-2-yl) anthracene); DSA (distyrylarylene); CDBP (4,4'-bis(9-carbazolyl)-2,2'-dimethylbiphenyl); MADN (2-Methyl-9,10-bis(naphthalen-2-yl)anthracene); TCP (1,3,5-tris(carbazol-9-yl)benzene); $Alq_3$ (tris(8-hydroxyquinolino) lithium); an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag and/or Au, a derivative thereof, or any combination thereof, but is not limited thereto.

The organic light emitting material included in the light emitting layers 212, 222, and 232 may be a depositable organic light emitting material that may be vaporized (sublimated) at a particular (or, alternatively, predetermined) temperature to be deposited, and may have a particular (or, alternatively, predetermined) sublimation temperature (Ts). Here, the sublimation temperature of a given compound or material may be a temperature at which a weight loss of 10% relative to the initial weight of the given compound or material occurs during thermogravimetric analysis (TGA) of the given compound or material at a low pressure of about 10 Pa or less (e.g., 0 Pa to about 10 Pa, about 0.01 Pa to about 10 Pa, about 0.1 Pa to about 10 Pa, about 1 Pa to about 10 Pa, or the like), and may be a deposition temperature during the process or a set temperature of a deposition chamber used in the process.

The sublimation temperature (Ts) of the organic light emitting material included in the light emitting layer 212, 222, and 232 may be less than or equal to about 350° C., and within the above range, less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., or less than or equal to about 250° C., about 100° C. to about 350° C., about 100° C. to about 340° C., about 100° C. to about 330° C., about 100° C. to about 320° C., about 100° C. to about 310° C., about 100° C. to about 300° C., about 100° C. to about 290° C., about 100° C. to about 280° C., about 100° C. to about 270° C., about 100° C. to about 260° C., about 100° C. to about 250° C., about 150° C. to about 350° C., about 150° C. to about 340° C., about 150° C. to about 330° C., about 150° C. to about 320° C., about 150° C. to about 310° C., about 150° C. to about 300° C., about 150° C. to about 290° C., about 150° C. to about 280° C., about 150° C. to about 270° C., about 150° C. to about 260° C., or about 150° C. to about 250° C. When the organic light emitting material has a sublimation temperature within the above range, it may be effectively deposited without substantial decomposition and/or deterioration of the organic light emitting material.

The photosensor 300 includes a photosensitive layer 330 between the pixel electrode 310 and the common electrode 320. The photosensitive layer 330 is in parallel with the light emitting layers 212, 222, and 232 of the first, second, and third light emitting elements 210, 220, and 230 along the in-plane direction (e.g., xy direction) of the substrate 110. The photosensitive layer 330 and the light emitting layers 212, 222, and 232 may be disposed on (e.g., along) the same in-plane direction.

The photosensitive layer 330 may be a photoelectric conversion layer that absorbs light of a particular (or, alternatively, predetermined) wavelength spectrum and converts it (the absorbed light) into an electrical signal, and may be configured to absorb the light emitted from at least one of the aforementioned first, second, or third light emitting elements 210, 220, or 230 and then reflected by the recognition target 40 and may convert the absorbed light into an electrical signal. The photosensitive layer 330 may be configured to absorb light of, for example, a red wavelength spectrum, a green wavelength spectrum, a blue wavelength spectrum, an infrared wavelength spectrum, or any combination thereof.

For example, the photosensitive layer 330 may be configured to selectively absorb light of a green wavelength spectrum having a peak absorption wavelength ($\lambda_{peak,A}$) in a wavelength spectrum of about 500 nm to about 600 nm, and may be configured to absorb light that is emitted from the green light emitting element among the first, second, and third light emitting elements 210, 220, and 230 and then reflected by the recognition target 40. The peak absorption wavelength ($\lambda_{peak,A}$) of the photosensitive layer 330 may belong to about 510 nm to about 580 nm, about 520 nm to about 570 nm, about 520 nm to about 560 nm, or about 520 nm to about 550 nm within the above range.

The photosensitive layer 330 may include a light absorbing semiconductor (hereinafter referred to as a "first semiconductor") configured to absorb light of the wavelength spectrum and photoelectrically convert the absorbed light. The first semiconductor may be a depositable organic light absorbing material that may be vaporized (sublimated) and deposited at a particular (or, alternatively, predetermined) temperature while exhibiting the aforementioned photoelectric conversion characteristics, and may have a particular (or, alternatively, predetermined) sublimation temperature (Ts).

The sublimation temperature of the first semiconductor may be less than or equal to about 300° C., within the above range, less than or equal to about 290° C., less than or equal to about 280° C., less than or equal to about 270° C., less than or equal to about 260° C., or less than or equal to about 250° C., about 100° C. to about 300° C., about 100° C. to about 290° C., about 100° C. to about 280° C., about 100° C. to about 270° C., about 100° C. to about 260° C., about 100° C. to about 250° C., about 150° C. to about 300° C., about 150° C. to about 290° C., about 150° C. to about 280° C., about 150° C. to about 270° C., about 150° C. to about 260° C., about 150° C. to about 250° C., about 200° C. to about 300° C., about 200° C. to about 290° C., about 200° C. to about 280° C., about 200° C. to about 270° C., about 200° C. to about 260° C., or about 200° C. to about 250° C.

The first semiconductor may not only have the aforementioned photoelectric conversion characteristics and thermal properties but also have process stability that it may be stably deposited at a relatively high temperature at a relatively high deposition rate and in addition, have high heat resistance that it is not decomposed and/or deteriorated in a subsequent long-term high temperature process of the sensor-embedded display panel 1000. For example, the first semiconductor may be stably deposited at a relatively high process temperature (deposition temperature) of greater than or equal to about 320° C. at a relatively high deposition rate of greater than or equal to about 3 Å/s, for example, at a process temperature (deposition temperature) of about 320° C. to about 380° C. at a deposition rate of about 3 Å/s to about 7 Å/s.

For example, the first semiconductor may be represented by Chemical Formula 1.

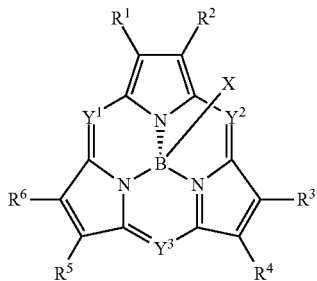

[Chemical Formula 1]

In Chemical Formula 1,

X may be a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, $Y^1$ may be N or $CR^{101}$, $Y^2$ may be N or $CR^{102}$, $Y^3$ may be N or $CR^{103}$, $R^1$ to $R^6$ and $R^{101}$ to $R^{103}$ may each independently be hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof, and $R^1$ to $R^6$ and $R^{101}$ to $R^{103}$ may be each independently present, or adjacent two of $R^1$ to $R^6$ and $R^{101}$ to $R^{103}$ may be linked to each other to form a ring.

For example, X may be a halogen, a substituted or unsubstituted C1 to C30 alkyl group, a substituted or unsubstituted C1 to C30 alkoxy group, a substituted or unsubstituted C6 to C30 aryloxy group, a substituted or unsubstituted silyloxy group, or any combination thereof, for example F; Cl; Br; I; a C1 to C30 alkyl group substituted with F, Cl, Br, I, or any combination thereof; a C1 to C30 alkoxy group substituted with F, Cl, Br, I, or any combination thereof; a substituted or unsubstituted phenoxy group; a substituted or unsubstituted naphthyloxy group; a silyloxy group substituted with a C1 to C10 alkyl group or a C6 to C20 aryl group; or any combination thereof.

For example, $Y^1$ to $Y^3$ may each be N.

For example, $Y^1$ may be $CR^{101}$, $Y^2$ may be $CR^{102}$, $Y^3$ may be $CR^{103}$, and $R^{101}$ to $R^{103}$ may be the same as or different from each other.

For example, $R^1$ to $R^6$ may each independently be hydrogen, a substituted or unsubstituted C1 to C30 alkyl group, a substituted or unsubstituted C6 to C30 aryl group, a halogen, or any combination thereof, for example a substituted or unsubstituted methyl group; a substituted or unsubstituted ethyl group; a substituted or unsubstituted propyl group; a substituted or unsubstituted butyl group; a substituted or unsubstituted phenyl group; a substituted or unsubstituted biphenyl group; a substituted or unsubstituted naphthyl group; F; Cl; Br; I; or any combination thereof.

For example, at least one of $R^1$ and $R^2$, $R^3$ and $R^4$, or $R^5$ and $R^6$ may be linked to each other to form a ring, and the ring may be, for example, a substituted or unsubstituted phenylene group, a substituted or unsubstituted naphthylene group, a substituted or unsubstituted nitrogen-containing divalent cyclic group, or any combination thereof.

As an example, the first semiconductor may be represented by Chemical Formula 1-1 or 1-2.

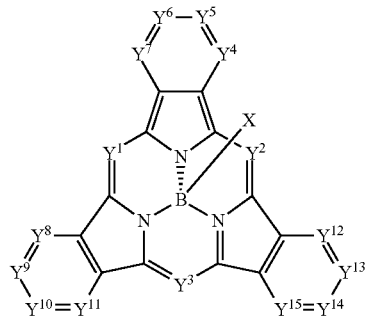

[Chemical Formula 1-1]

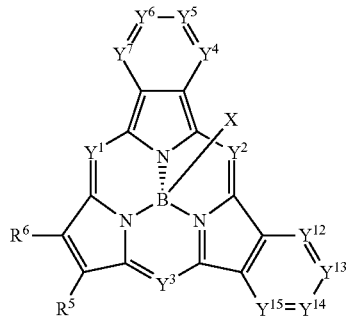

[Chemical Formula 1-2]

In Chemical Formula 1-1 or 1-2,

X, $Y^1$ to $Y^3$, $R^5$, and $R^6$ are as described above, such that X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, $Y^1$ is N or $CR^{101}$, $Y^2$ is N or $CR^{102}$, $Y^3$ is N or $CR^{103}$, and $R^5$, $R^6$ and $R^{101}$ to $R^{103}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof, $Y^4$ may be N or $CR^{104}$, $Y^5$ may be N or $CR^{105}$, $Y^6$ may be N or $CR^{106}$, $Y^7$ may be N or $CR^{107}$, $Y^8$ may be N or $CR^{108}$, $Y^9$ may be N or $CR^{109}$, $Y^{10}$ may be N or $CR^{110}$;

$Y^{11}$ may be N or $CR^{111}$;

$Y^{12}$ may be N or $CR^{112}$;

$Y^{13}$ may be N or $CR^{113}$;

$Y^{14}$ may be N or $CR^{114}$;

$Y^{15}$ may be N or $CR^{115}$, and $R^{104}$ to $R^{115}$ may each independently be hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof.

For example, $Y^4$ to $Y^{15}$ may each be $CR^{104}$, $CR^{105}$, $CR^{106}$, $CR^{107}$, $CR^{108}$, $CR^{109}$, $CR^{110}$, $CR^{111}$, $CR^{112}$, $CR^{113}$, $CR^{114}$, and $CR^{115}$, and $R^{104}$ to $R^{115}$ may be the same or different from each other.

For example, one or both of $Y^4$ to $Y^7$ may be N.

For example, one or both of $Y^8$ to $Y^{11}$ may be N.

For example, one or both of $Y^{12}$ to $Y^{15}$ may be N.

For example, the first semiconductor may be represented by any one of Chemical Formulas 1A to 1D.

[Chemical Formula 1A]

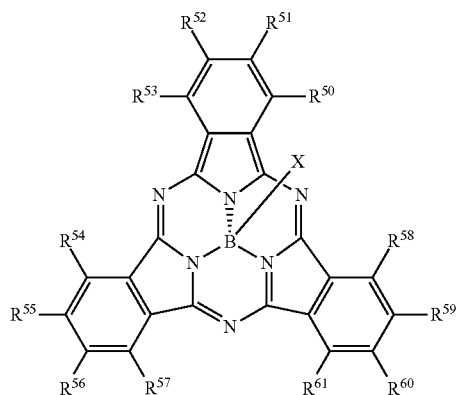

[Chemical Formula 1B]

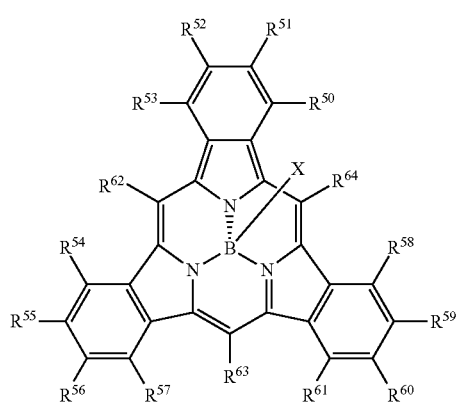

[Chemical Formula 1C]

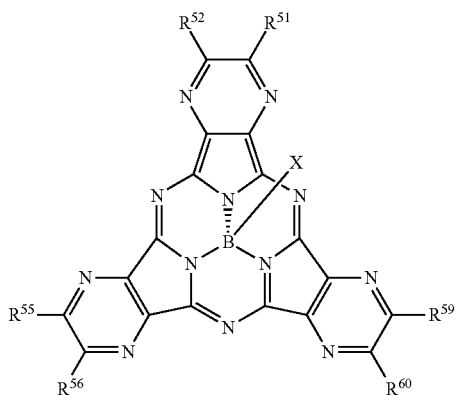

[Chemical Formula 1D]

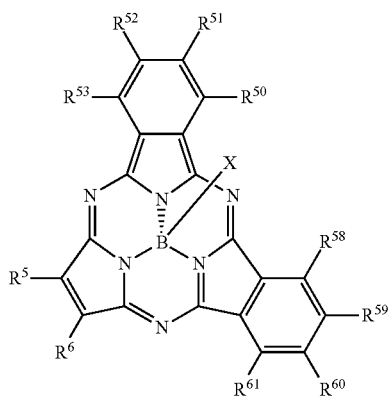

In Chemical Formulas 1A to 1D,

X, $R^5$, and $R^6$ are the same as described above, such that X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, and $R^5$, and $R^6$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof, and $R^{50}$ to $R^{64}$ may each independently be hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof.

For example, $R^{50}$ to $R^{64}$ may each independently be hydrogen, a substituted or unsubstituted C1 to C30 alkyl group, a substituted or unsubstituted C6 to C30 aryl group, a halogen, or any combination thereof, and for example each independently hydrogen; a methyl group; an ethyl group; a propyl group; a butyl group; a methyl group substituted with F, Cl, Br, I, or any combination thereof; an ethyl group substituted with F, Cl, Br, I, or any combination thereof; a propyl group substituted with F, Cl, Br, I, or any combination thereof; a butyl group substituted with F, Cl, Br, I, or any combination thereof; a phenyl group; a phenyl group substituted with F, Cl, Br, I, or any combination thereof; F; Cl; Br; I; or any combination thereof.

For example, $R^{50}$ to $R^{64}$ may each independently be hydrogen.

For example, $R^{51}$, $R^{52}$, $R^{55}$, $R^{56}$, $R^{59}$, and $R^{60}$ may each independently be F, Cl, Br or I, and $R^{50}$, $R^{53}$, $R^{54}$, $R^{57}$, $R^{58}$, and $R^{61}$ may each be hydrogen.

For example, $R^{62}$, $R^{63}$, and $R^{64}$ may each independently be hydrogen, a substituted or unsubstituted phenyl group, a substituted or unsubstituted biphenyl group, a substituted or unsubstituted naphthyl group, F, Cl, Br, I, or any combination thereof.

For example, the first semiconductor may be a compound represented by any one of Chemical Formulas 1AA to 1DD, but is not limited thereto.

[Chemical Formula 1AA]

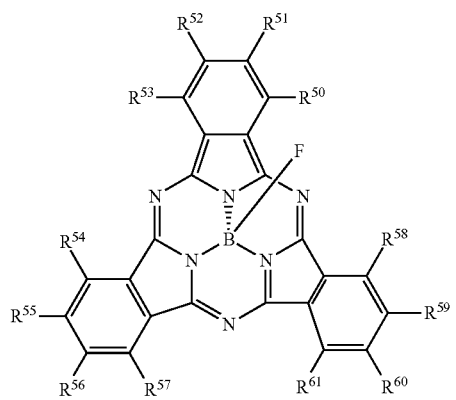

[Chemical Formula 1AB]

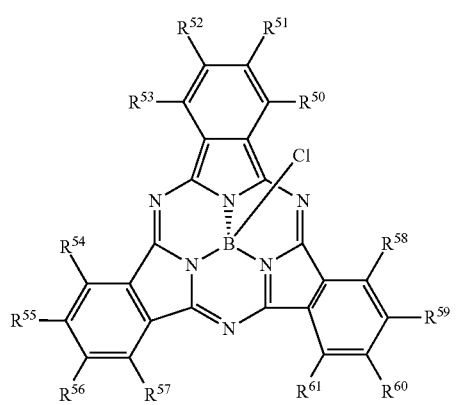

[Chemical Formula 1AC]

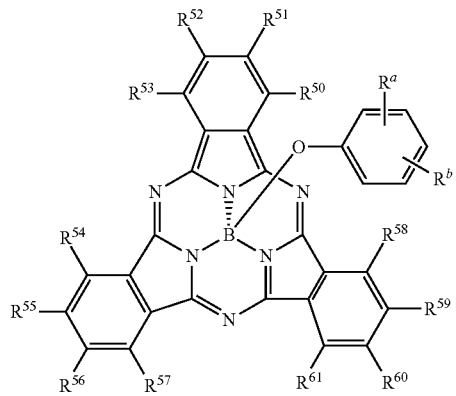

[Chemical Formula 1AD]

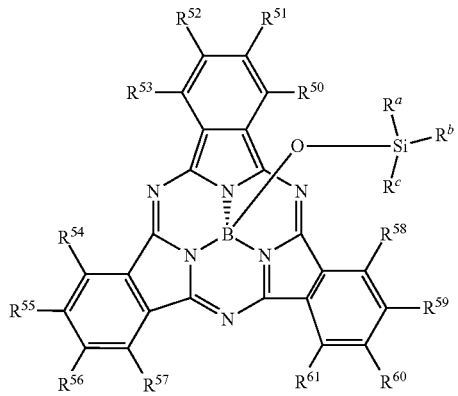

[Chemical Formula 1BA]

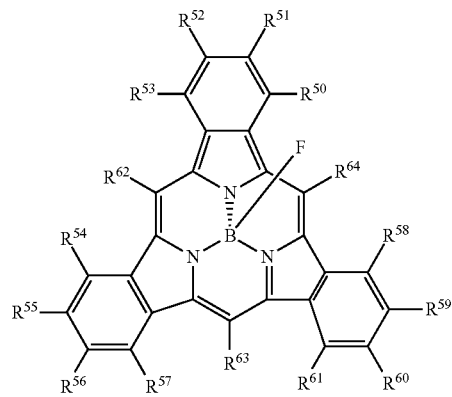

-continued
[Chemical Formula 1BB]
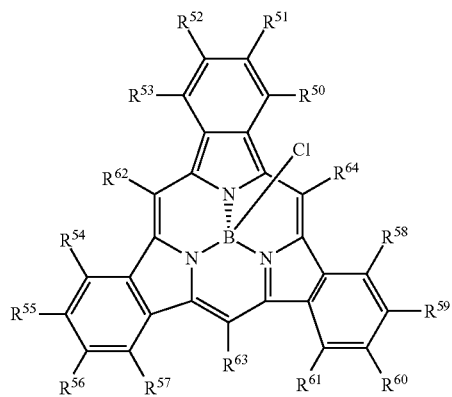
[Chemical Formula 1BC]
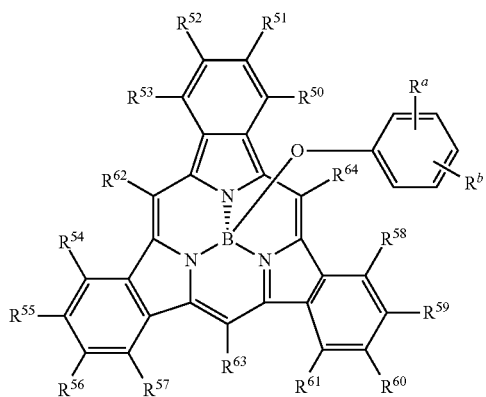
[Chemical Formula 1BD]
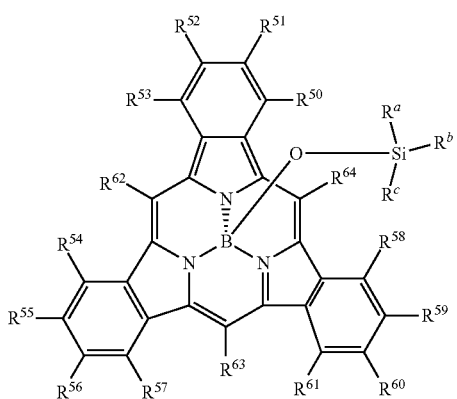
[Chemical Formula 1CA]
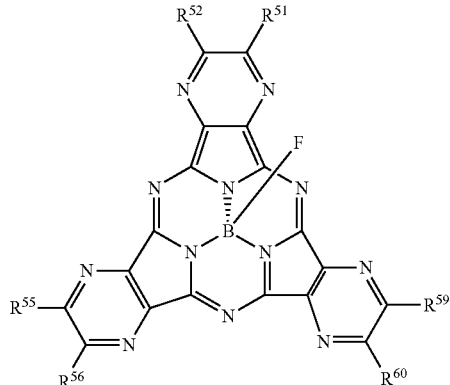
[Chemical Formula 1CB]
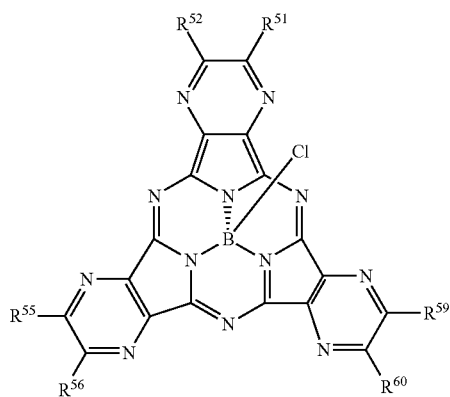
[Chemical Formula 1CC]
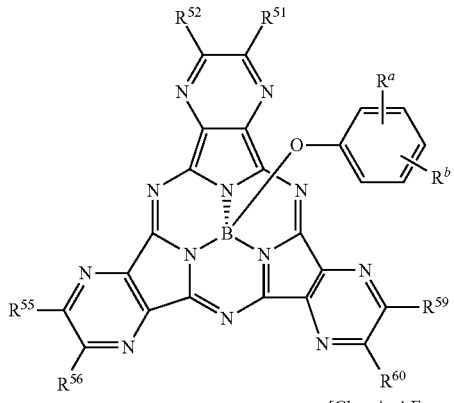
[Chemical Formula 1CD]
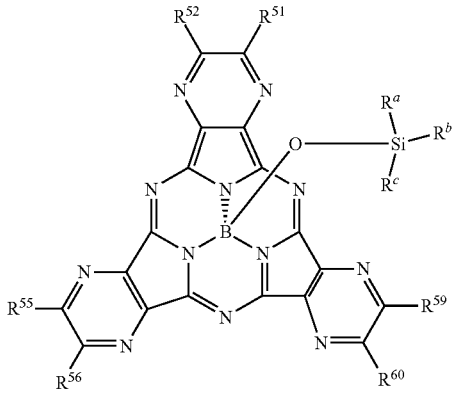

[Chemical Formula 1DA]

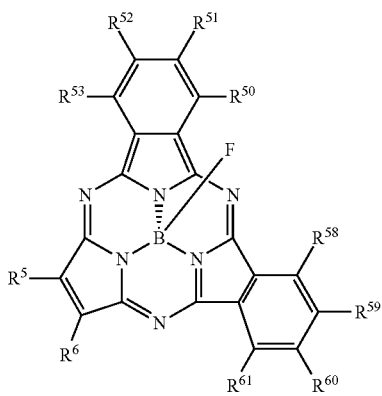

[Chemical Formula 1DB]

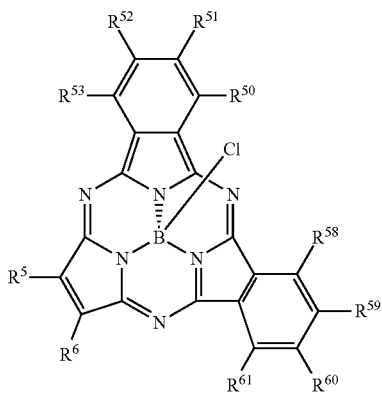

[Chemical Formula 1DC]

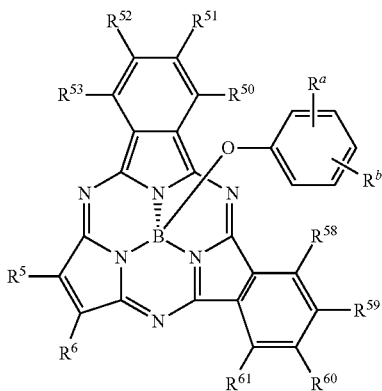

[Chemical Formula 1DD]

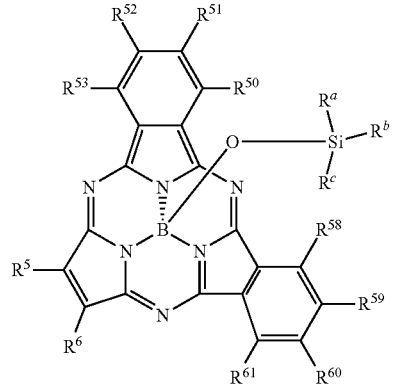

In Chemical Formulas 1AA to 1DD, $R^5$, $R^6$, and $R^{50}$ to $R^{64}$ are the same as described above, such that $R^5$, $R^6$, and $R^{50}$ to $R^{64}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof, and $R^a$ to $R^c$ may each independently be hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof.

The photosensitive layer 330 may further include a second semiconductor capable of forming a pn junction with the first semiconductor. One of the first or second semiconductors may be a p-type semiconductor and the other may be an n-type semiconductor. The p-type semiconductor and the n-type semiconductor may form a pn junction, and after receiving light from the outside to generate excitons, the generated excitons are separated into holes and electrons to be moved into a pixel electrode 310 and a common electrode 320 individually.

For example, the first semiconductor may be a p-type semiconductor and the second semiconductor may be an n-type semiconductor. The first semiconductor may have an energy level capable of forming effective electrical matching with the adjacent first common auxiliary layer 350 so that the separated charges (e.g., holes) may be effectively moved and/or extracted toward the pixel electrode 310. For example, a difference between the Highest Occupied Molecular Orbital (HOMO) energy level of the first common auxiliary layer 350 and the HOMO energy level of the first semiconductor may be less than about 1.0 eV, within the above range, less than or equal to about 0.9 eV, less than or equal to about 0.8 eV, less than or equal to about 0.7 eV, or less than or equal to about 0.5 eV, greater than or equal to about eV and less than about 1.0 eV, about 0 eV to about 0.9 eV, about 0 eV to about eV, about 0 eV to about 0.7 eV, about 0 eV to about 0.5 eV, greater than or equal to about 0.01 eV and less than about 1.0 eV, about 0.01 eV to about 0.9 eV, about 0.01 eV to about 0.8 eV, about 0.01 eV to about 0.7 eV, or about 0.01 eV to about 0.5 eV.

The second semiconductor may be, for example, a transparent material that is configured to not substantially absorb light in a visible wavelength spectrum, such that the second semiconductor is configured to absorb less than 10% of incident light in the visible light wavelength spectrum, the second semiconductor is configured to absorb less than 1% of incident light in the visible light wavelength spectrum, or the like. The transparent material may have a wide energy bandgap such that it does not substantially absorb light in the visible wavelength spectrum. For example, it may have an energy bandgap of greater than or equal to about 2.5 eV, for example, about 2.5 eV to about 6.0 eV within the above range.

In addition, the second semiconductor may have an energy level that effectively matches with the second common auxiliary layer 340 so that the separated charges (e.g., electrons) may be effectively moved and/or extracted toward the common electrode 320. For example, a difference between a Lowest Unoccupied Molecular Orbital (LUMO) energy level of the second common auxiliary layer 340 and a LUMO energy level of the second semiconductor may be less than about 1.0 eV, and within the above range, less than or equal to about 0.9 eV, less than or equal to about 0.8 eV, less than or equal to about 0.7 eV, or less than or equal to about 0.5 eV, greater than or equal to about 0 eV and less than about 1.0 eV, about 0 eV to about 0.9 eV, about 0 eV to about 0.8 eV, about 0 eV to about 0.7 eV, about 0 eV to about 0.5 eV, greater than or equal to about 0.01 eV and less than about 1.0 eV, about 0.01 eV to about 0.9 eV, about 0.01 eV to about 0.8 eV, about 0.01 eV to about 0.7 eV, or about 0.01 eV to about 0.5 eV. The LUMO energy level of the second semiconductor (n-type semiconductor) may be about 2.5 eV to about 3.5 eV, but is not limited thereto.

The first and second semiconductors may have a relatively small difference in sublimation temperatures so that they may be deposited in the same chamber. For example, a difference between the sublimation temperature of the first semiconductor and the sublimation temperature of the second semiconductor may be less than about 150° C., within the above range, for example less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., less than or equal to about 20° C., less than or equal to about 15° C., or less than or equal to about 10° C., within the above range, greater than or equal to about 0° C. and less than about 150° C., about 0° C. to about 140° C., about 0° C. to about 130° C., about 0° C. to about 120° C., about 0° C. to about 110° C., about 0° C. to about 100° C., about 0° C. to about 90° C., about 0° C. to about 80° C., about 0° C. to about 70° C., about 0° C. to about 60° C., about 0° C. to about 50° C., about 0° C. to about 40° C., about 0° C. to about 30° C., about 0° C. to about 20° C., about 0° C. to about 15° C., about 0° C. to about 10° C., greater than or equal to about 2° C. and less than about 150° C., about 2° C. to about 140° C., about 2° C. to about 130° C., about 2° C. to about 120° C., about 2° C. to about 110° C., about 2° C. to about 100° C., about 2° C. to about 90° C., about 2° C. to about 80° C., 2° C. to about 70° C., about 2° C. to about 60° C., about 2° C. to about 50° C., about 2° C. to about 40° C., about 2° C. to about 30° C., about 2° C. to about 20° C., about 2° C. to about 15° C., or about 2° C. to about 10° C.

For example, the sublimation temperature of the second semiconductor may be less than or equal to about 380° C., within the above range, less than or equal to about 360° C., less than or equal to about 350° C., less than or equal to about 330° C., less than or equal to about 320° C., less than or equal to about 300° C., less than or equal to about 280° C., less than or equal to about 270° C., less than or equal to about 260° C., or less than or equal to about 250° C., about 100° C. to about 380° C., about 100° C. to about 360° C., about 100° C. to about 350° C., about 100° C. to about 330° C., about 100° C. to about 320° C., about 100° C. to about 300° C., about 100° C. to about 280° C., about 100° C. to about 270° C., about 100° C. to about 260° C., about 100° C. to about 250° C., about 150° C. to about 380° C., about 150° C. to about 360° C., about 150° C. to about 350° C., about 150° C. to about 330° C., about 150° C. to about 320° C., about 150° C. to about 300° C., about 150° C. to about 290° C., about 150° C. to about 280° C., about 150° C. to about 270° C., about 150° C. to about 260° C., about 150° C. to about 250° C., about 200° C. to about 380° C., about 200° C. to about 360° C., about 200° C. to about 350° C., about 200° C. to about 330° C., about 200° C. to about 320° C., about 200° C. to about 300° C., about 200° C. to about 290° C., about 200° C. to about 280° C., about 200° C. to about 270° C., about 200° C. to about 260° C., or about 200° C. to about 250° C.

For example, the sublimation temperature of the first semiconductor may be less than or equal to about 380° C., within the above range, less than or equal to about 360° C., less than or equal to about 350° C., less than or equal to about 330° C., less than or equal to about 320° C., less than or equal to about 300° C., less than or equal to about 280° C., less than or equal to about 270° C., less than or equal to about 260° C., or less than or equal to about 250° C., about 100° C. to about 380° C., about 100° C. to about 360° C., about 100° C. to about 350° C., about 100° C. to about 330° C., about 100° C. to about 320° C., about 100° C. to about 300° C., about 100° C. to about 280° C., about 100° C. to about 270° C., about 100° C. to about 260° C., about 100° C. to about 250° C., about 150° C. to about 380° C., about 150° C. to about 360° C., about 150° C. to about 350° C., about 150° C. to about 330° C., about 150° C. to about 320° C., about 150° C. to about 300° C., about 150° C. to about 290° C., about 150° C. to about 280° C., about 150° C. to about 270° C., about 150° C. to about 260° C., about 150° C. to about 250° C., about 200° C. to about 380° C., about 200° C. to about 360° C., about 200° C. to about 350° C., about 200° C. to about 330° C., about 200° C. to about 320° C., about 200° C. to about 300° C., about 200° C. to about 290° C., about 200° C. to about 280° C., about 200° C. to about 270° C., about 200° C. to about 260° C., or about 200° C. to about 250° C.

For example, the sublimation temperatures of the first and second semiconductors may be less than or equal to about 300° C., respectively, and may be about 100° C. to about 300° C. within the above range.

In order to satisfy these electrical and thermal characteristics, fullerenes such as C60 and C70, and their derivatives, which are generally used as n-type semiconductors, may be excluded from the second semiconductor, such that the second semiconductor does not include (e.g., excludes) any fullerenes or any of their derivatives, and further such that the photosensitive layer 330 may not include (e.g., may exclude) any or all fullerenes and/or any or all of their derivatives, and further such that the photosensor 300 may not include (e.g., may exclude) any or all fullerenes and/or any or all of their derivatives. Here, the fullerene derivative may be a compound having one or more substituents on the fullerene core, such as C60 or C70. For example, the photosensitive layer 330 may not include fullerene and its derivatives (e.g., may not include any fullerenes or any of their derivatives). Accordingly, the second semiconductor may be selected from non-fullerene n-type semiconductors, and may be depositable low molecular weight organic semiconductors satisfying the aforementioned electrical and thermal characteristics.

As an example, the second semiconductor may be a compound represented by Chemical Formula 2 or 3.

[Chemical Formula 2]

[Chemical Formula 3]

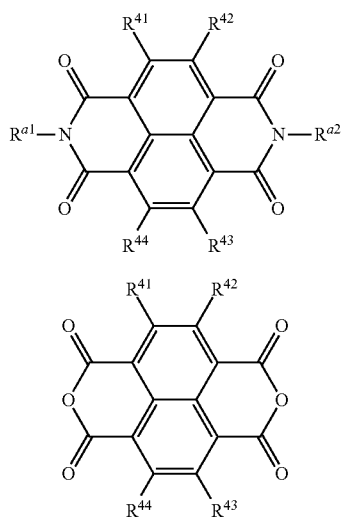

In Chemical Formulas 2 and 3,
$R^{41}$ to $R^{44}$, $R^{a1}$ and $R^{a2}$ may each independently be hydrogen, deuterium, a substituted or unsubstituted C1 to C30 alkyl group, a substituted or unsubstituted C6 to C30 aryl group, a substituted or unsubstituted C3 to C30 heterocyclic group, a halogen, a cyano group, or any combination thereof.

For example, at least one of $R^{a1}$ or $R^{a2}$ may include an electron withdrawing group, and for example at least one of $R^{a1}$ or $R^{a2}$ may include a halogen; a cyano group; a halogen-substituted C1 to C30 alkyl group; a halogen-substituted C6 to C30 aryl group; a halogen-substituted C3 to C30 heterocyclic group; a cyano-substituted C1 to C30 alkyl group; a cyano-substituted C6 to C30 aryl group; a cyano-substituted C3 to C30 heterocyclic group; a substituted or unsubstituted pyridinyl group; a substituted or unsubstituted pyrimidinyl group; a substituted or unsubstituted triazinyl group; a substituted or unsubstituted pyrazinyl group; a substituted or unsubstituted quinolinyl group; a substituted or unsubstituted isoquinolinyl group; a substituted or unsubstituted quinazolinyl group; a C1 to C30 alkyl group substituted with a substituted or unsubstituted pyridinyl group; a C6 to C30 aryl group substituted with a substituted or unsubstituted pyridinyl group; a C1 to C30 alkyl group substituted with a substituted or unsubstituted pyrimidinyl group; a C6 to C30 aryl group substituted with a substituted or unsubstituted pyrimidinyl group; a C1 to C30 alkyl group substituted with a substituted or unsubstituted triazinyl group; a C6 to C30 aryl group substituted with a substituted or unsubstituted triazinyl group; a C1 to C30 alkyl group substituted with a substituted or unsubstituted pyrazinyl group; a C6 to C30 aryl group substituted with a substituted or unsubstituted pyrazinyl group; a C1 to C30 alkyl group substituted with a substituted or unsubstituted quinolinyl group; a C6 to C30 aryl group substituted with a substituted or unsubstituted quinolinyl group; a C1 to C30 alkyl group substituted with a substituted or unsubstituted isoquinolinyl group; a C6 to C30 aryl group substituted with a substituted or unsubstituted isoquinolinyl group; a C1 to C30 alkyl group substituted with a substituted or unsubstituted quinazolinyl group; a C6 to C30 aryl group substituted with a substituted or unsubstituted quinazolinyl group; or any combination thereof.

The photosensitive layer 330 may include an intrinsic layer (I-layer) in which the aforementioned p-type semiconductor (e.g., first semiconductor) and n-type semiconductor (e.g., second semiconductor) are blended in a bulk heterojunction form. For example, the photosensitive layer 330 may include a p-type layer including a p-type semiconductor (e.g., a first semiconductor) and an n-type layer including an n-type semiconductor (e.g., a second semiconductor). The photosensitive layer 330 may be included in various combinations, for example, an I-layer, a p-type layer/I-layer, an I-layer/n-type layer, a p-type layer/I-layer/n-type layer, and the like. The I-layer may include, for example, a p-type semiconductor (e.g., a first semiconductor) and an n-type semiconductor (e.g., a second semiconductor), and may be a co-deposition layer of a p-type semiconductor (e.g., the first semiconductor) and an n-type semiconductor (e.g., a second semiconductor).

The photosensitive layer 330 may be a bi-layer (p-type layer/n-type layer) including a p-type layer including a p-type semiconductor (e.g., a first semiconductor) and an n-type layer including the aforementioned n-type semiconductor (e.g., a second semiconductor). When the photosensitive layer 330 is a bi-layer (p-type layer/n-type layer), the p-type layer may be disposed close to the pixel electrode 310 and the n-type layer may be disposed close to the common electrode 320. The p-type layer may be made of, for example, a p-type semiconductor (e.g., the first semiconductor) and may be a single deposited layer of the p-type semiconductor (e.g., the first semiconductor). The n-type layer may be made of, for example, an n-type semiconductor (e.g., a second semiconductor) and may be a single deposited layer of an n-type semiconductor (e.g., a second semiconductor).

For example, the photosensitive layer 330 may include an I layer made of the first semiconductor (p-type semiconductor) represented by Chemical Formula 1 and the second semiconductor (non-fullerene n-type semiconductor).

For example, the photosensitive layer 330 may include a first photosensitive layer (p-type layer) made of the first semiconductor (p-type semiconductor) represented by Chemical Formula 1 and a second photosensitive layer (n-type layer) made of a second semiconductor (non-fullerene n-type semiconductor).

For example, as described above, the light emitting layers 212, 222, and 232 of the light emitting elements 210, 220, and 230 may include organic light emitting materials, and the organic light emitting materials of the light emitting layers 212, 222, and 232 and the first and second semiconductors of the photosensitive layer 330 may be vacuum-deposited in the same chamber. Accordingly, differences between the sublimation temperatures of the organic light emitting materials of the light emitting layers 212, 222, and 232 and the first and second semiconductors of the photosensitive layer 330 may be relatively small, and for example, the differences in the sublimation temperatures of the organic light emitting materials and the first and second semiconductors (e.g., a difference between any two of the sublimation temperature of the first semiconductor of the photosensitive layer 330, the sublimation temperature of the second semiconductor of the photosensitive layer 330, and a sublimation temperature of the organic light emitting material of one or more of the light emitting layers 212, 222, and 232) may be less than about 150° C., within the above range, for example less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., less than or equal to about 20° C., less than or equal to about 15° C., or less than or equal to about 10° C., within the above range, greater than or equal to about 0° C. and less than about 150° C., about 0° C. to about 140° C., about 0° C. to about 130° C., about 0° C. to about 120° C., about 0° C. to about 110° C., about 0° C. to about 100° C., about 0° C. to about 90° C., about 0° C. to about 80° C., about 0° C. to about 70° C., about 0° C. to about 60° C., about 0° C. to about 50° C., about 0° C. to about 40° C., about 0° C. to about 30° C., about 0° C. to about 20° C., about 0° C. to about 15° C., about 0° C. to about 10° C., greater than or equal to about 2° C. and less than about 150° C., about 2° C. to about 140° C., about 2° C. to about 130° C., about 2° C. to about 120° C., about 2° C. to about 110° C., about 2° C. to about 100° C., about 2° C. to about 90° C., about 2° C. to about 80° C., about 2° C. to about 70° C., about 2° C. to about 60° C., about 2° C. to about 50° C., about 2° C. to about 40° C., about 2° C. to about 30° C., about 2° C. to about 20° C., about 2° C. to about 15° C., or about 2° C. to about 10° C.

For example, the sublimation temperatures of the organic light emitting materials of the light emitting layer 212, 222, and 232 may be less than or equal to about 350° C., within the above range, less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., or less than or equal to about 250° C., about 100° C. to about 350° C., about 100° C. to about 340° C., about 100° C. to about 330° C., about 100° C. to about 320° C., about 100° C. to about 310° C., about 100° C. to about 300° C., about 100° C. to about 290° C., about 100° C. to about 280° C., about 100° C. to about 270° C., about 100° C. to about 250° C., about 150° C. to about 350° C., about 150° C. to about 340° C., about 150° C. to about 330° C., about 150° C. to about 320° C., about 150° C. to about 310° C., about 150° C. to about 300° C., about 150° C. to about 290° C., about 150° C. to about 280° C., about 150° C. to about 270° C., or about 150° C. to about 250° C.

For example, the sublimation temperatures of the organic light emitting materials of the light emitting layers 212, 222, and 232, the first and second semiconductors of the photosensitive layer 330 may be less than or equal to about 300° C., respectively, and within the above range, about 100° C. to about 300° C.

As described above, the first semiconductor (e.g., p-type semiconductor) and the second semiconductor (e.g., n-type semiconductor) of the photosensitive layer 330 may achieve effective electrical matching with the first and second common auxiliary layers 350 and 340, respectively. Since the organic light emitting materials of the light emitting layers 212, 222, and 232 and the first and second semiconductors of the photosensitive layer 330 have thermal characteristics in a similar range (e.g., similar sublimation temperatures, for example respective sublimation temperatures within a same temperature range of about 100° C. to about 300° C.), the sensor may be effectively installed in the display panel without deterioration of electrical characteristics and complexity of the process. Thus, based on the sensor-embedded display panel 1000 including a photosensor 300 having a photosensitive layer 330 that has thermal characteristics (e.g., sublimation temperature) as the light emitting layers 212, 222, and 232 of the light emitting elements 210, 220, and 230 of the sensor-embedded display panel 1000, based at least in part upon the photosensitive layer 330 of the photosensor 300 including a first semiconductor having the aforementioned compound represented by Chemical Formula 1 (e.g., to serve as a p-type semiconductor) and a second semiconductor that is a non-fullerene material (e.g., to serve as an n-type semiconductor to form a pn junction with the first semiconductor), the ease and efficiency of manufacture of the sensor-embedded display panel 1000 with reduced likelihood of defects due to reduced likelihood of deteriorated electrical characteristics and reduced manufacturing process complexity due to the ability to deposit the layers 212, 222, and 232, and 330 in a same chamber, for example as part of a single, continuous manufacturing and/or deposition process, due to the aforementioned similar thermal characteristics. As a result, the including of the aforementioned compound represented by Chemical Formula 1 and the non-fullerene second semiconductor in a photosensitive layer 330 of a photosensor 300 of a sensor-embedded display panel 1000 may enable reduced manufacturing cost and complexity to manufacture said sensor-embedded display panel 1000 and may further reduce the likelihood of manufacturing defects in the sensor-embedded display panel 1000 which may further improve the reliability and performance of the sensor-embedded display panel 1000.

Each thickness of the light emitting layers 212, 222, and 232 and the photosensitive layer 330 may each independently be about 5 nm to about 300 nm, about 10 nm to about 250 nm, about 20 nm to about 200 nm, or about 30 nm to about 180 nm within the above range. Differences between the thicknesses of the light emitting layers 212, 222, and 232 and the photosensitive layer 330 may be less than or equal to about 20 nm, less than or equal to about 15 nm, less than or equal to about 10 nm, or less than or equal to about 5 nm within the above range, and the thicknesses of the light emitting layers 212, 222, and 232 and the photosensitive layer 330 may be substantially the same.

On the first, second and third light emitting elements 210, 220, and 230 and the photosensor 300, the encapsulation layer 50 is formed. The encapsulation layer 50 may include, for example, a glass plate, a metal thin film, an organic layer, an inorganic layer, an organic/inorganic layer, or any combination thereof. The organic layer may include, for example, an acrylic resin, a (meth)acrylic resin, polyisoprene, a vinyl resin, an epoxy resin, a urethane resin, a cellulose resin, a perylene resin, or any combination thereof, but is not limited thereto. The inorganic layer may include, for example, oxide, nitride, and/or oxynitride, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or any combination thereof, but is not limited thereto. The organic/inorganic layer may include, for example, polyorganosiloxane but is not limited thereto. The encapsulation layer 50 may have one layer or two or more layers.

As described above, the sensor-embedded display panel 1000 according to some example embodiments includes the first, second, and third light emitting elements 210, 220, and 230 configured to emit light in a particular (or, alternatively, predetermined) wavelength spectrum to display colors, and the photosensor 300 configured to absorb light reflected by the recognition target 40 and convert it into an electrical signal, in the same plane on the substrate 110, thereby performing a display function and a recognition function (e.g., biometric recognition function). Accordingly, unlike conventional display panels formed outside the display panel or formed under the display panel by manufacturing the sensor as a separate module, the sensor-embedded display panel 1000 according to some example embodiments may improve performance without increasing the thickness, implementing a slim-type high performance sensor-embedded display panel 1000.

In addition, since the photosensor 300 uses light emitted from the first, second, and/or third light emitting elements 210, 220, and 230, a recognition function (e.g., biometric recognition function) may be performed without a separate light source. Therefore, it is not necessary to provide a separate light source outside the display panel, thereby preventing a decrease in the aperture ratio of the display panel due to the area occupied by the separate light source, and at the same time saving power consumed by the separate light source to improve power consumption.

In addition, since the photosensors 300 may be disposed anywhere in the non-display area NDA, they may be disposed at a desired location of the sensor-embedded display panel 1000 as many as desired. Therefore, for example, by randomly or regularly arranging the photosensor 300 over the entire sensor-embedded display panel 1000, the biometric recognition function may be performed on any portion of the screen of an electronic device such as a mobile device and the biometric recognition function may be selectively performed only in a specific location where the biometric recognition function is required.

In addition, as described above, the first, second, and third light emitting elements 210, 220, and 230 and the photosensor 300 share the common electrode 320, the first common auxiliary layer 350, and the second common auxiliary layer 340 and thus the structure and process may be simplified compared with the case where the first, second, and third light emitting elements 210, 220, and 230 and the photosensor 300 are formed in separate processes.

In addition, as described above, the organic light emitting material included in the light emitting layers 212, 222, and 232 of the first, second, and third light emitting elements 210, 220, and 230 and the first and second semiconductors included in the photosensitive layer 330 of the photosensor 300 have a sublimation temperature within the particular (or, alternatively, predetermined) ranges and may be deposited in a continuous process in the same chamber. Accordingly, the first, second, and third light emitting elements 210, 220, and 230 and the photosensor 300 may be manufactured in one process and thus realize a display panel conducting both a display function and a recognition function (e.g., a biometric recognition function) without a substantial additional process.

In addition, the photosensor 300 may be an organic sensor including an organic photosensitive layer and have more than twice light absorption, compared with an inorganic diode such as a silicon photodiode, and thus a higher sensing function with a thinner thickness.

In addition, as described above, the aforementioned first semiconductor is included in the photosensitive layer 330 of the photosensor 300 and may achieve high process stability that it may be stably deposited at a relatively high temperature at a relatively high deposit rate and simultaneously, realize high heat resistance without decomposition and/or deterioration in the subsequent long-term high temperature process. Accordingly, the photosensor 300 may have sufficient light absorption characteristics and thus high photoelectric conversion characteristics and thereby, may be effectively applied to the large-area sensor-embedded display panel 1000.

The aforementioned sensor-embedded display panel 1000 may be applied to electronic devices such as various display devices. Electronic devices such as display devices may be applied to, for example, mobile phones, video phones, smart phones, smart pads, smart watches, digital cameras, tablet PCs, laptop PCs, notebook computers, computer monitors, wearable computers, televisions, digital broadcasting terminals, e-books, personal digital assistants (PDAs), portable multimedia player (PMP), enterprise digital assistant (EDA), head mounted display (HMD), vehicle navigation, Internet of Things (IoT), Internet of all things (IoE), drones, door locks, safes, automatic teller machines (ATM), security devices, medical devices, or automotive electronic components, but are not limited thereto.

While the photosensor 300 is illustrated in FIGS. 1 and 2 as being included in a sensor-embedded display panel, it will be understood that example embodiments are not limited thereto. For example, in some example embodiments, the photosensor 300 may be provided separately from a sensor-embedded display panel 1000 (e.g., as a photosensor provided in an electronic device according to any of the example embodiments). The photosensor 300 may be independently provided as comprising at least first and second electrodes 310 and 320 and a photosensitive layer 330 between the first and second electrodes 310 and 320 (e.g., as shown in FIG. 2), where the photosensitive layer 330 includes the first semiconductor including the aforementioned compound represented by Chemical Formula 1. The photosensitive layer 330 may further include a second semiconductor that is a non-fullerene semiconductor (e.g., the second semiconductor excludes any fullerenes), for example as a bi-layer of the first and second semiconductors, a heterogenous mixture of the first and second semiconductors, a uniform or substantially uniform (e.g., homogenous) mixture of the first and second semiconductors, any combination thereof, or the like. In some example embodiments, the photosensor 300 may optionally include a first auxiliary layer 350 between the first electrode 310 and the photosensitive layer 330 and/or a second auxiliary layer 340 between the second electrode 320 and the photosensitive layer 330, but example embodiments are not limited thereto and in some example embodiments the photosensor 300 may omit one or both of the first and second auxiliary layers 350 and 340. Such a photosensor 300 including the aforementioned compound represented by Chemical Formula 1, together with or separately from the aforementioned second semiconductor, may be configured to provide a photosensor that may be manufactured more efficiently, for example in a less complex manufacturing process wherein the photosensor 300 is included in a manufactured device (which may be a different device from the sensor-embedded display panel 1000) in a single, continuous process in a single chamber (e.g., a process wherein the photosensitive layer 330 is formed in a same process as another portion of the photosensor 300 and/or another portion of an electronic device in which the photosensor 300 is included) based on similar thermal properties (e.g., sublimation temperature) of the photosensitive layer 330 and the other portion of the photosensor 300 and/or the electronic device. Such a photosensor 300 may have reduced likelihood of electrical deterioration as a result of the manufacturing process and thus may have reduced defects and corresponding improved reliability and/or photosensing performance.

While the photosensitive layer 330 is illustrated in FIGS. 1 and 2 as being included in a photosensor 300, it will be understood that example embodiments are not limited thereto. For example, in some example embodiments photosensitive layer 330 may be provided separately from any photosensor 300, for example as a thin film. Such a thin film may include the first semiconductor including the aforementioned compound represented by Chemical Formula 1 and the second semiconductor that is a non-fullerene semiconductor (e.g., the second semiconductor excludes any or all fullerenes), for example as a bi-layer, a heterogenous mixture of the first and second semiconductors, a uniform or substantially uniform (e.g., homogenous) mixture of the first and second semiconductors, any combination thereof, or the like.

While the aforementioned compound represented by Chemical Formula 1 is described as being included in a photosensitive layer 330 which may be included in a photosensor 300 which itself may be included in a sensor-embedded display panel 1000, example embodiments are not limited thereto. For example, in some example embodiments, the aforementioned compound represented by Chemical Formula 1 may be provided independently of other compounds (e.g., independently of the aforementioned second semiconductor).

FIG. 3 is a schematic view illustrating an example of a smart phone as an electronic device according to some example embodiments.

Referring to FIG. 3, the electronic device 2000 according to some example embodiments may include the aforementioned sensor-embedded display panel 1000, the sensor-embedded display panel 1000 having the photosensor 300 on the whole or a portion of the area of the sensor-embedded display panel 1000, and thus a biometric recognition function may be performed on any portion of the screen, and according to the user's selection, the biometric recognition function may be selectively performed only at a specific location where the biometric recognition function is required.

An example of a method of recognizing the recognition target 40 in an electronic device 2000 such as a display device may include, for example, driving the first, second, and third light emitting elements 210, 220, and 230 of the sensor-embedded display panel 1000 and the photosensor 300 to detect the light reflected from the recognition target 40 among the light emitted from the first, second, and third light emitting elements 210, 220, and 230, in the photosensor 300; comparing the image of the recognition target 40 stored in advance with the image of the recognition target 40 detected by the photosensor 300; and judging the consistency of the compared images and if they match according to the determination that recognition of the recognition target 40 is complete, turning off the photosensor 300, permitting user's access to the display device, and driving the sensor-embedded display panel 1000 to display an image.

FIG. 4 is a schematic view illustrating an example of a configuration view of an electronic device according to some example embodiments.

Referring to FIG. 4, in addition to the aforementioned constituent elements (e.g., the sensor-embedded display panel 1000), the electronic device 2000 may further include a bus 1310, a processor 1320, a memory 1330, and at least one additional device 1340. Information of the aforementioned sensor-embedded display panel 1000, processor 1320, memory 1330, and at least one additional device 1340 may be transmitted to each other through the bus 1310. In some example embodiments, the at least one additional device 1340 may be omitted. In some example embodiments, the sensor-embedded display panel 1000 may be replaced by an independent photosensor 300. In some example embodiments, the sensor-embedded display panel 1000 may be replaced by a display device including, for example, exclusively light emitting elements and no light absorption sensors, while the at least one additional device 1340 may include one or a plurality (e.g., an array) of photosensors according to any of the example embodiments which may serve as a biometric sensor, a camera, or the like.

The processor 1320 may include one or more articles (e.g., units, instances, etc.) of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1320 may, for example, control a display operation of the sensor-embedded display panel 1000 or control a sensor operation of the photosensor 300.

The memory 1330 may be a non-transitory computer readable storage medium, such as, for example, as a solid state drive (SSD) and may store an instruction program (e.g., program of instructions), and the processor 1320 may perform a function related to the sensor-embedded display panel 1000 by executing the stored instruction program.

The one or more additional devices 1340 may be one or more communication interfaces (e.g., wireless communication interfaces, wired interfaces), user interfaces (e.g., keyboard, mouse, buttons, etc.), power supply and/or power supply interfaces, or any combination thereof.

The units and/or modules described herein may be implemented using hardware constituent elements and software constituent elements. The units and/or modules described herein may include, may be included in, and/or may be implemented by one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/ output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to any of the example embodiments may be recorded in a non-transitory computer readable storage device including program instructions for implementing various operations of the aforementioned embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes; optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of some example embodiments.

Hereinafter, some example embodiments are illustrated in more detail with reference to examples. However, the present scope of the inventive concepts is not limited to these examples.

Synthesis Example I: Synthesis of p-Type Semiconductor

Synthesis Example 1

[Compound A]

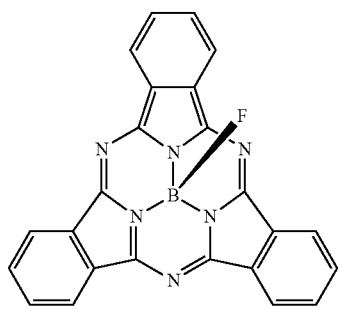

Under a nitrogen atmosphere, 5.5 g (12.8 mmol) of Compound B according to Synthesis Example 2 and 3.1 g (16.0 mmol, 1.3 eq) of silver tetrafluoroborate are added to 1.8 L of toluene and then, stirred at 65° C. for 4 hours. Subsequently, the mixture is cooled to room temperature, and after removing the solvent under a reduced pressure, a solid is obtained therefrom by vacuum-drying. The obtained solid is Soxhlet-extracted by using methylene chloride for 24 hours. Subsequently, the solvent is recovered and removed therefrom under a reduced pressure, and a solid obtained therefrom is vacuum-dried. The solid is dissolved in toluene and purified through silica gel column chromatography. Then, acetone is added to the obtained solid and then, washed with an ultrasonic wave cleaner for 5 minutes. Subsequently, the acetone suspension is filtered to recover a solid, and the solid is vacuum-dried and purified by sublimation, obtaining 3.3 g of Compound A. Yield: 74%, Purity: 99.9%, $^1$H NMR (500 MHz, CDCl3): δ8.87-8.89; (m, 6H), 7.92-7.94; (m, 6H).

Synthesis Example 2

[Compound B]

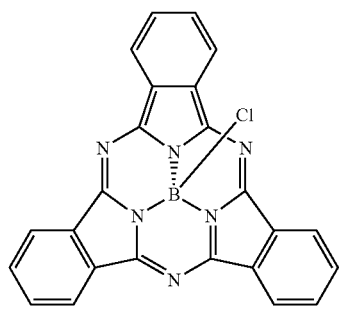

Compound B (Commercial reagent, Lum-Tec MDV Technology) is purified by sublimation.

Synthesis Example 3

[Compound C]

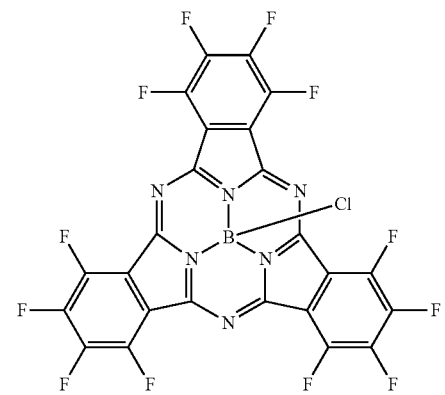

A compound of 3,4,5,6-tetrafluorophthalonitrile (4.0 g, 25 mmol, 3 eq) and para xylene (p-xylene) (45 mL) are put in a round-bottomed flask under a nitrogen atmosphere, and while stirring, boron trichloride (1.0 M in xylene, 43 mL, 5.3 eq) is added thereto. The produced reactant is stirred under reflux for 24 hours. Subsequently, the reactant is cooled to room temperature, and a solvent thereof is concentrated under a reduced pressure. The obtained black purple solid is dissolved in tetrahydrofuran and then, filtered with a silica pad and then, concentrated under a reduced pressure. The obtained solid is vacuum-dried and purified by sublimation, obtaining 2 g of Compound C. Yield: 37%, HRMS (MALDI) calculated for C24BClF12N6: m/z 645.9774, Found: 645.9778.

Synthesis Example 4

[Compound D]

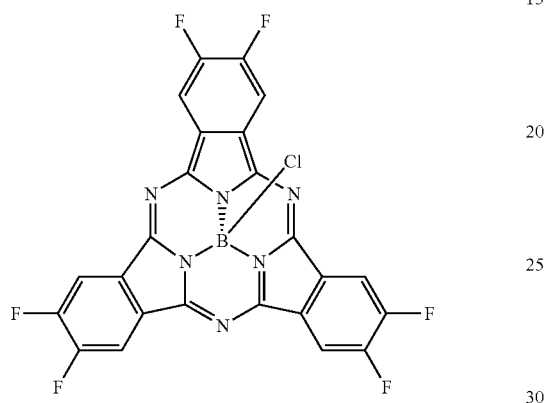

In a round-bottomed flask, while 4,5-difluorophthalonitrile (4.0 g, 24.6 mmol, 3 eq) and 110 mL of 1,2-dichlorobenzene are stirred under a nitrogen atmosphere, boron trichloride (1.0 M in heptane, 60 mL, 60 mmol, 7.2 eq) is added thereto. The produced reactant is distilled to remove heptane by using a short path condenser and then, stirred under reflux for 24 hours at 180° C. After cooling the obtained resulting material to room temperature, a solvent is removed therefrom. The obtained solid is dissolved in chloroform, filtered with silica, and concentrated under a reduced pressure to remove a solvent. The solid is vacuum-dried and purified by sublimation, obtaining Compound D. Yield: 35%, Purity: 99% UPLC, HRMS (MALDI) calculated for C24H6BClF6N6: m/z 538.0340, Found: 538.0342.

Synthesis Example 5

[Compound E]

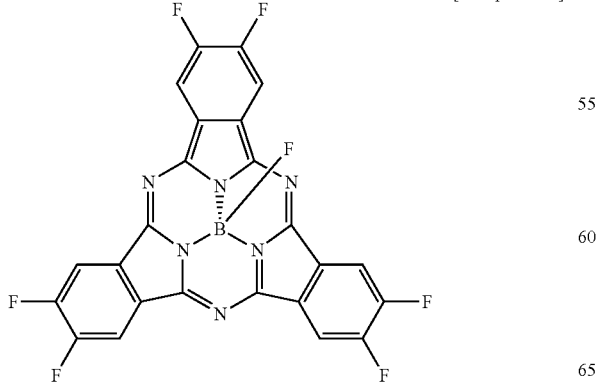

Compound D (1.1 g, 2.0 mmol) according to Synthesis Example 4 is added to 15 mL of toluene and then, stirred, and boron trifluoride diethyl etherate (BF3·Oet2, 2.5 mL, 21 mmol, 10 eq) is added thereto and then, stirred under a nitrogen atmosphere for 1.5 hours. After removing a solvent and BF3·Oet2 by using a short path condenser, the reactant is cooled to room temperature and dissolved again in chloroform and then, filtered with silica. A product obtained therefrom is vacuum-dried and purified by sublimation, obtaining Compound E. Yield: 23%, Purity: 100% UPLC, HRMS (MALDI) calculated for C24H6BF7N6: m/z 522.0635, Found: 522.0638.

Synthesis Example 6

[Compound F]

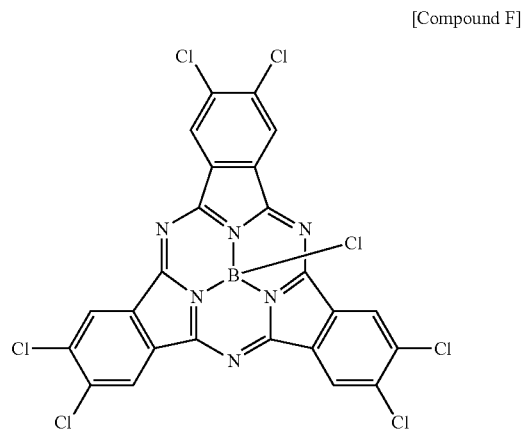

Compound F (Commercial reagent, Lum-Tec MDV Technology) is purified by sublimation.

Synthesis Example 7

[Compound G]

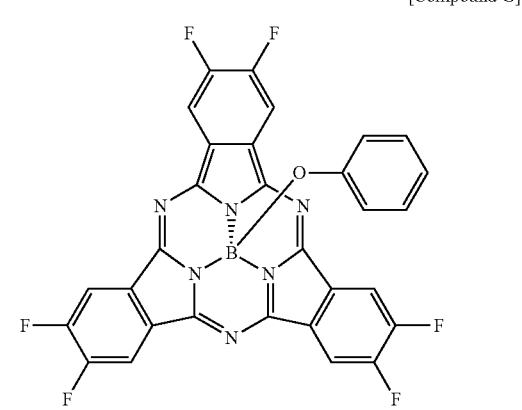

Compound D (1.1 g, 2.0 mmol) according to Synthesis Example 4 is added to 15 mL of toluene and then, stirred, and boron trifluoride diethyl etherate (BF3·Oet2, 2.5 mL, 21 mmol, 10 eq) is added thereto and then, stirred under reflux under a nitrogen atmosphere for 1.5 hours. After removing a solvent and BF3·Oet2 by using a short path condenser, the reactant is cooled again to room temperature, dissolved in chloroform, and filtered with silica. Subsequently, a resulting material is dissolved in chloroform and then, recrystallize by hexane and purified by sublimation, obtaining Compound G. Yield: 19%, Purity: 100% UPLC, HRMS (MALDI) calculated for C30H11BF6N6O: m/z 596.0992, Found: 596.0994.

Synthesis Example 8

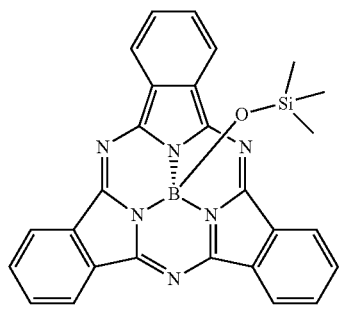

[Compound I]

Under a nitrogen atmosphere, to a round-bottomed flask, Compound B (2.00 g, 4.63 mmol) according to Synthesis Example 2, silver trifluoroethane sulfonate) (1.49 g, 5.78 mmol, 1.25 eq), and potassium trimethyl siloxide (2.32 g, 16.25 mmol, 3.50 eq) are moved. Subsequently, 400 ml of toluene is added thereto and then, stirred at 50° C. for 12 hours. The reactant is cooled to room temperature, and after removing a solvent under a reduced pressure, 500 ml of methylene chloride is added thereto and then, stirred to dissolve a product. Subsequently, the solution is filtered, and a solid obtained by removing a solvent under a reduced pressure is purified through silica gel column chromatography by using methylene chloride and ethylacetate. Then, the solid is reprecipitated by using methylene chloride and hexane, filtered, vacuum-dried, and purified by sublimation, obtaining 0.95 g of Compound I. Yield: 42%, Purity: 99.95%, $^1$H NMR (500 MHz, CD$_2$Cl$_2$): δ 8.84-8.82; (m, 6H), 7.93-7.91; (m, 6H), −0.12; (s, 9H).

Synthesis Example 9

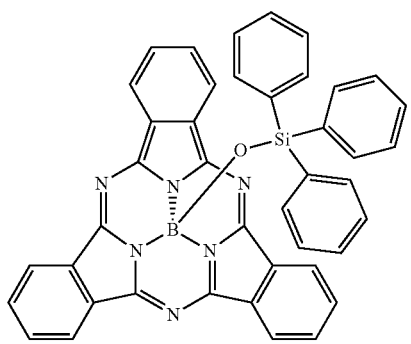

[Compound J]

2.3 g of Compound J is obtained in the same manner as in Synthesis Example 8 except that triphenylsilanol (3.20 g, 11.56 mmol, 2.50 eq) is used instead of the potassium trimethyl siloxide. Yield: 62%, Purity: 99.95%, $^1$H NMR (500 MHz, CD$_2$Cl$_2$): δ 8.74-8.73; (m, 6H), 7.90-7.87; (m, 6H), 7.18; (t, 3H), 7.05; (t, 6H), 6.72; (d, 6H).

Synthesis Example II: Synthesis of n-Type Semiconductor

Synthesis Example 10

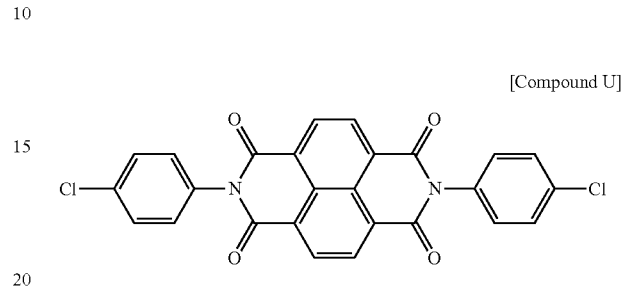

[Compound U]

A mixture of 1,4,5,8-naphthalenetetracarboxylic dianhydride (1 eq.) and 4-chloroaniline (2.2 eq.) is dissolved in a dimethyl formamide (DMF) solvent and then, put in a two-necked and round-bottomed flask and stirred at 180° C. for 24 hours. Subsequently, after decreasing the temperature to room temperature, methanol is added thereto to produce a product, and the product is filtered, obtaining a powder-type material. Then, the material is several times washed with methanol and purified by recrystallization with ethyl acetate and dimethylsulfoxide (DMSO). The obtained product is put in an oven and dried under vacuum at 80° C. for 24 hours, obtaining Compound U. A yield is 50% or more.

$^1$H-NMR (300 MHz, CDCl$_3$ with Hexafluoroisopropanol): δ=8.85; (s, 4H), 7.63; (s, 4H), 7.60; (s, 4H).

Evaluation I

Each compound according to Synthesis Examples is deposited on a glass substrate, and energy levels of the deposited thin film is evaluated.

A HOMO energy level may be evaluated by irradiating UV light on the thin film with AC-2 (Hitachi, Ltd.) or AC-3 (Riken Keiki Co., LTD.) and measuring an amount of photoelectrons according to energy.

An LUMO energy level may be calculated by obtaining bandgap energy with UV-Vis spectrometer (Shimadzu Corp.) and using the HOMO energy level.

The results are shown in Tables 1 and 2.

TABLE 1

| Synthesis Example Nos. | HOMO (eV) | LUMO (eV) | Energy bandgap (eV) |
|---|---|---|---|
| 1 | 5.5 | 3.5 | 2.0 |
| 2 | 5.6 | 3.6 | 2.0 |
| 3 | 6.3 | 4.3 | 2.0 |
| 4 | 6.2 | 3.5 | 2.7 |
| 5 | 6.1 | 4.0 | 2.1 |
| 6 | 6.1 | 4.1 | 2.0 |
| 7 | 6.0 | 3.3 | 2.7 |
| 8 | 5.4 | 2.7 | 2.7 |
| 9 | 5.4 | 2.7 | 2.7 |

TABLE 2

|  | HOMO (eV) | LUMO (eV) | Energy bandgap (eV) |
|---|---|---|---|
| Synthesis Example 10 | 6.19 | 3.20 | 2.99 |

Evaluation II

The compounds according to Synthesis Examples are evaluated with respect to a sublimation temperature.

The sublimation temperature is evaluated through thermogravimetric analysis (TGA) by heating a sample and checking a temperature at which a weight of the sample decreases by 10% relative to the initial weight under high vacuum (less than or equal to about 10 Pa).

The results are shown in Tables 3 and 4.

TABLE 3

| Synthesis Example Nos. | $T_{s(10)}$(° C.) |
|---|---|
| 1 | 252 |
| 2 | 272 |
| 3 | 194 |
| 5 | 236 |

* $T_{s(10)}$(° C.): Temperature at which a weight of a sample decreases by 10% relative to the initial weight (sublimation temperature)

TABLE 4

| Synthesis Example Nos. | $T_{s(10,}$ ° C.) |
|---|---|
| 10 | 270 |

Evaluation III

The compounds of Synthesis Examples are evaluated with respect to heat resistance.

After measuring initial purity of the compounds according to Synthesis Examples, the compounds are sealed in a differential scanning calorimetry (DSC) pan and then, loaded in a chamber and heated for 300 hours, while monitoring each process temperature and each process temperature ($T_p$, $T_p=T_{s\ 10}+70°$ C. or so) in the same vacuum environment ($<10^{-6}$ torr). Subsequently, the compounds are taken and measured again with respect to purity.

The results are shown in Table 5.

TABLE 5

| Synthesis Example Nos. | Purity before heat resistance evaluation | Purity after heat resistance evaluation |
|---|---|---|
| 1 | 92.92 | 93.69 |
| 2 | 83.85 | 92.92 |
| 5 | 99.99 | 99.99 |

Referring to Table 5, the compounds according to Synthesis Examples exhibit no purity decrease before and after the heat treatment.

EXAMPLES: MANUFACTURE OF PHOTOSENSOR

Example 1

Al (10 nm), ITO (100 nm), and Al (8 nm) are sequentially deposited on a glass substrate to form a lower electrode (work function: 4.9 eV) with an Al/ITO/Al structure. On the lower electrode, N,N'-bis(3-methylphenyl)-N,N'-diphenyl-[1,1-biphenyl]-4,4'-diamine is deposited to form a hole auxiliary layer (HOMO: 5.3 to 5.6 eV, LUMO: 2.0 to 2.3 eV). On the hole auxiliary layer, Compound A according to Synthesis Example 1 is deposited to form a 10 nm-thick p-type semiconductor layer, and Compound U according to Synthesis Example 10 is deposited to form a 40 nm-thick n-type semiconductor layer, obtaining a bi-layered photosensitive layer. On the bi-layered photosensitive layer, 4,7-diphenyl-1,10-phenanthroline is deposited to form an electron auxiliary layer (HOMO: 6.1 to 6.4 eV, LUMO: 2.9 to 3.2 eV). On the electron auxiliary layer, magnesium and silver are deposited to form an Mg:Ag upper electrode, manufacturing a photosensor.

Example 2

A photosensor is manufactured in the same manner as in Example 1 except that Compound B according to Synthesis Example 2 instead of Compound A according to Synthesis Example 1 is used to form the p-type semiconductor layer.

Example 3

A photosensor is manufactured in the same manner as in Example 1 except that Compound C according to Synthesis Example 3 instead of Compound A according to Synthesis Example 1 is used to form the p-type semiconductor layer.

Example 4

A photosensor is manufactured in the same manner as in Example 1 except that Compound E according to Synthesis Example 5 instead of Compound A according to Synthesis Example 1 is used to form the p-type semiconductor layer.

Example 5

A photosensor is manufactured in the same manner as in Example 1 except that Compound F according to Synthesis Example 6 instead of Compound A according to Synthesis Example 1 is used to form the p-type semiconductor layer.

Evaluation IV

Light absorption characteristics and electrical characteristics of the photosensors according to Examples are evaluated.

The light absorption characteristics are evaluated from a peak absorption wavelength ($\lambda_{peak}$) and a full width at half maximum (FWHM) of an absorption spectrum.

The electrical characteristics are evaluated from external quantum efficiency (EQE) and a dark current under a reverse bias voltage. The EQE may be evaluated from EQE at the peak absorption wavelength ($\lambda_{peak}$) after allowed to stand at 85° C. for 1 hour, which may be Incident Photon to Current Efficiency (IPCE) at blue (450 nm, B), green ($\lambda_{peak}$, G), and 630 nm (red, R) wavelengths at 3 V. The dark current is evaluated by measuring a dark current with current-voltage evaluation device (Keithley K4200 parameter analyzer) after allowed to stand for 1 hour at 85° C. and dividing it by a unit pixel area (0.04 cm²), and dark current density is evaluated from a current flowing when a reverse bias of −3 V is applied thereto. The results are shown in Table 6.

TABLE 6

| | $\lambda_{peak}$ (nm) | EQE (@ −3 V, 85° C. 1 h, %) (Green) | D.C (mA/cm$^2$) |
|---|---|---|---|
| Example 1 | 559 | 34.6 | 9.8 × 10$^{-7}$ |
| Example 2 | 562 | 13.0 | 9.8 × 10$^{-7}$ |
| Example 3 | 574 | 20.1 | 1.7 × 10$^{-6}$ |
| Example 4 | 552 | 31.5 | 1.9 × 10$^{-6}$ |
| Example 5 | 575 | 20.0 | 1.2 × 10$^{-6}$ |

Referring to Table 6, the photosensors according to Examples exhibit sufficient optical and electrical characteristics.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A sensor-embedded display panel, comprising:
   a light emitting element on a substrate, the light emitting element including a light emitting layer, and
   a photosensor on the substrate, the photosensor including a photosensitive layer arranged in parallel with the light emitting layer along an in-plane direction of the substrate such that the photosensor and the light emitting layer at least partially overlap in the in-plane direction,
   wherein the light emitting element and the photosensor further include separate, respective portions of a first common auxiliary layer under each of the light emitting layer and the photosensitive layer and connected to each other to be a single piece of material extending continuously between the light emitting element and the photosensor, and
   wherein the photosensitive layer includes a first semiconductor represented by Chemical Formula 1 and a second semiconductor forming a pn junction with the first semiconductor, the second semiconductor not including any fullerenes:

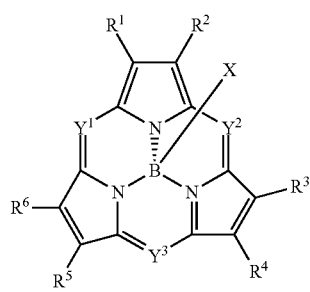

[Chemical Formula 1]

wherein, in Chemical Formula 1,
X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, $Y^1$ is N or $CR^{101}$,
$Y^2$ is N or $CR^{102}$,
$Y^3$ is N or $CR^{103}$;
$R^1$ to $R^6$ and $R^{101}$ to $R^{103}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof, and
$R^1$ to $R^6$ and $R^{101}$ to $R^{103}$ are each independently present, or adjacent two of $R^1$ to $R^6$ and $R^{101}$ to $R^{103}$ are linked to each other to form a ring.

2. The sensor-embedded display panel of claim 1, further comprising:
   a common electrode configured to apply a same voltage to the light emitting element and the photosensor.

3. The sensor-embedded display panel of claim 2, wherein the light emitting element and the photosensor further include separate, respective portions of a second common auxiliary layer between the common electrode and the light emitting layer and between the common electrode and the photosensitive layer and connected to each other to be a separate single piece of material extending continuously between the light emitting element and the photosensor.

4. The sensor-embedded display panel of claim 3, wherein a difference between a Lowest Unoccupied Molecular Orbital (LUMO) energy level of the second semiconductor and a LUMO energy level of the second common auxiliary layer is greater than or equal to about 0 eV and less than about 1.0 eV.

5. The sensor-embedded display panel of claim 1, wherein a difference between a sublimation temperature of the first semiconductor and a sublimation temperature of the second semiconductor is greater than or equal to about 0° C. and less than about 150° C., wherein each sublimation temperature is a temperature at which a weight loss of 10% relative to an initial weight occurs during thermogravimetric analysis at 10 Pa or less.

6. The sensor-embedded display panel of claim 5, wherein the sublimation temperature of the first semiconductor is about 100° C. to about 300° C., and
   the sublimation temperature of the second semiconductor is about 100° C. to about 350° C.

7. The sensor-embedded display panel of claim 5, wherein the light emitting layer comprises an organic light emitting material, and
   a difference between any two of the sublimation temperature of the first semiconductor, the sublimation temperature of the second semiconductor, and a sublimation temperature of the organic light emitting material is greater than or equal to about 0° C. and less than about 150° C.

8. The sensor-embedded display panel of claim 1, wherein the sensor-embedded display panel comprises
   a display area configured to display one or more colors, and
   a non-display area excluding the display area, and
   the light emitting element is in the display area and the photosensor is in the non-display area.

9. The sensor-embedded display panel of claim 8, wherein the light emitting element comprises a first light emitting element configured to emit light of a red wavelength spectrum, a second light emitting element configured to emit light of a green wavelength spectrum, and a third light emitting element configured to emit light of a blue wavelength spectrum, the display area includes
a plurality of first subpixels configured to display light of the red wavelength spectrum and comprising the first light emitting element,
a plurality of second subpixels configured to display light of the green wavelength spectrum and comprising the second light emitting element, and
a plurality of third subpixels configured to display light of the blue wavelength spectrum and comprising the third light emitting element, and
the photosensor is between at least two subpixels of a first subpixel of the plurality of first subpixels, a second subpixel of the plurality of second subpixels, or a third subpixel of the plurality of third subpixels.

10. The sensor-embedded display panel of claim 1, wherein
at least one of $R^1$ and $R^2$, $R^3$ and $R^4$, or $R^5$ and $R^6$ is linked to each other to form a substituted or unsubstituted phenylene group, a substituted or unsubstituted naphthylene group, a substituted or unsubstituted nitrogen-containing divalent ring group, or any combination thereof.

11. The sensor-embedded display panel of claim 1, wherein
the first semiconductor is represented by Chemical Formula 1-1 or 1-2:

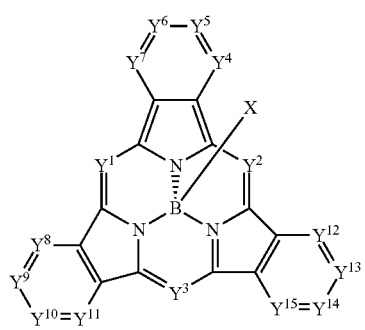

[Chemical Formula 1-1]

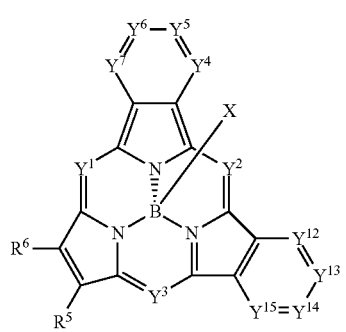

[Chemical Formula 1-2]

wherein, in Chemical Formula 1-1 or 1-2,
X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, $Y^1$ is N or $CR^{101}$,
$Y^2$ is N or $CR^{102}$,
$Y^3$ is N or $CR^{103}$,
$Y^4$ is N or $CR^{104}$,
$Y^5$ is N or $CR^{105}$,
$Y^6$ is N or $CR^{106}$,
$Y^7$ is N or $CR^{107}$,
$Y^8$ is N or $CR^{108}$,
$Y^9$ is N or $CR^{109}$,
$Y^{10}$ is N or $CR^{110}$,
$Y^{11}$ is N or $CR^{111}$,
$Y^{12}$ is N or $CR^{112}$,
$Y^{13}$ is N or $CR^{113}$,
$Y^{14}$ is N or $CR^{114}$,
$Y^{15}$ is N or $CR^{115}$, and
$R^5$, $R^6$ and $R^{101}$ to $R^{115}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof.

12. The sensor-embedded display panel of claim 1, wherein
the first semiconductor is represented by one of Chemical Formulas 1A to 1D:

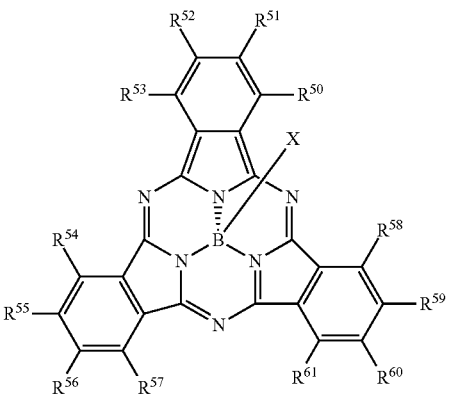

[Chemical Formula 1A]

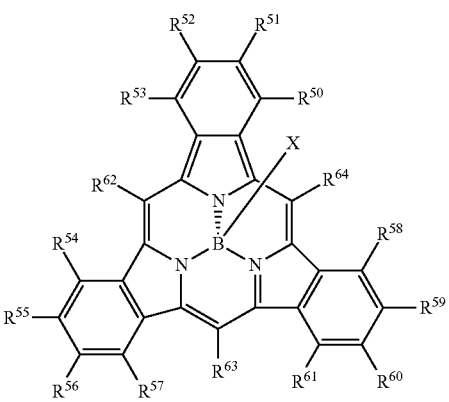

[Chemical Formula 1B]

-continued

[Chemical Formula 1C]

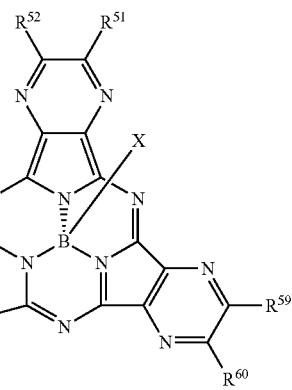

[Chemical Formula 1D]

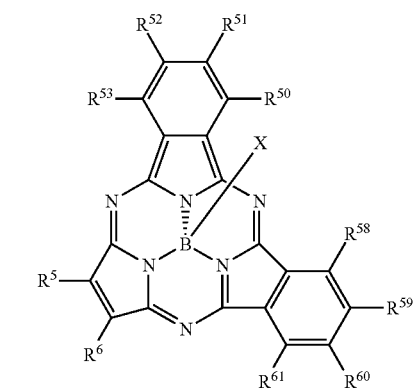

wherein, in Chemical Formulas 1A to 1D,
X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, and
$R^5$, $R^6$, and $R^{50}$ to $R^{64}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof.

13. The sensor-embedded display panel of claim 1, wherein
a difference between a Highest Occupied Molecular Orbital (HOMO) energy level of the first semiconductor and a HOMO energy level of the first common auxiliary layer is greater than or equal to about 0 eV and less than about 1.0 eV.

14. The sensor-embedded display panel of claim 1, wherein
the second semiconductor comprises a transparent semiconductor that does not substantially absorb light in a visible wavelength spectrum.

15. The sensor-embedded display panel of claim 1, wherein
the light emitting element comprises first, second, and third light emitting elements configured to emit light of different wavelength spectra from each other, and
the photosensor is configured to absorb light emitted from at least one of the first, second, or third light emitting elements and then reflected by a recognition target and convert the absorbed light into an electrical signal.

16. An electronic device comprising the sensor-embedded display panel of claim 1.

17. A sensor-embedded display panel, comprising:
a display area configured to display colors and a non-display area excluding the display area,
wherein the display area includes
a first subpixel configured to display a first color and comprising a first light emitting element,
a second subpixel configured to display a second color and comprising a second light emitting element, and
a third subpixel configured to display a third color and comprising a third light emitting element,
wherein the non-display area includes a photosensor between at least two of the first subpixel, the second subpixel, or the third subpixel,
wherein the first light emitting element includes a first light emitting layer configured to emit light of an emission spectrum corresponding to the first color,
wherein the second light emitting element includes a second light emitting layer configured to emit light of an emission spectrum corresponding to the second color,
wherein the third light emitting element includes a third light emitting layer configured to emit light of an emission spectrum corresponding to the third color,
the photosensor includes a photosensitive layer configured to absorb light emitted from at least one of the first, second, or third light emitting elements and then reflected by a recognition target and to convert the absorbed light into an electrical signal, and
the photosensitive layer includes a first semiconductor represented by Chemical Formula 1:

[Chemical Formula 1]

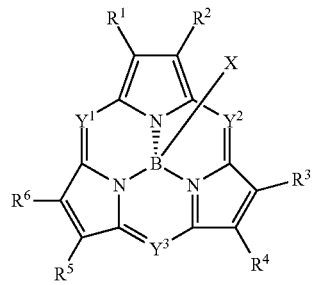

wherein, in Chemical Formula 1,
X is a halogen, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C6 to C30 aryloxy group, a substituted or unsubstituted C3 to C30 heterocyclic group, a substituted or unsubstituted silyl group, a substituted or unsubstituted silyloxy group, or any combination thereof, $Y^1$ is N or $CR^{101}$,
$Y^2$ is N or $CR^{102}$,
$Y^3$ is N or $CR^{103}$,
$R^1$ to $R^6$ and $R^{101}$ to $R^{103}$ are each independently hydrogen, deuterium, a substituted or unsubstituted C1 to C30 alkyl group, a substituted or unsubstituted C1 to C30 alkoxy group, a substituted or unsubstituted C1 to C30 alkylthio group, a substituted or unsubstituted C6 to C30 aryl group, a substituted or unsubstituted C3 to C30 heterocyclic group, a halogen, a cyano group, a nitro group, or any combination thereof, and
$R^1$ to $R^6$ and $R^{101}$ to $R^{103}$ are each independently present, or adjacent two of $R^1$ to $R^6$ and $R^{101}$ to $R^{103}$ are linked to each other to form a ring.

18. The sensor-embedded display panel of claim 17, wherein
the first, second, and third light emitting elements and the photosensor are arranged in parallel along an in-plane direction of a substrate such that the first, second, and third light emitting elements and the photosensor at least partially overlap in the in-plane direction.

19. The sensor-embedded display panel of claim 17, wherein
the first, second, and third light emitting elements and the photosensor comprise
separate, respective pixel electrodes separately in the first, second and third light emitting elements and the photosensor,
separate, respective portions of a common electrode configured to apply a common voltage to the first, second and third light emitting elements and the photosensor,
separate, respective portions of a first common auxiliary layer between the pixel electrodes of the first, second, and third light emitting elements and the first, second, and third light emitting layers and between the pixel electrode of the photosensor and the photosensitive layer, respectively, and connected to each other as a single piece of material extending continuously between the first, second, and third light emitting elements and the photosensor, and
separate, respective portions of a second common auxiliary layer between the common electrode and the first, second, and third light emitting layers and between the common electrode and the photosensitive layer, respectively, and connected to each other as a separate single piece of material extending continuously between the first, second, and third light emitting elements and the photosensor.

20. The sensor-embedded display panel of claim 17, wherein
the photosensitive layer further comprises a second semiconductor forming a pn junction with the first semiconductor,
the first semiconductor is a light absorbing material having a peak absorption wavelength in a wavelength spectrum of about 500 nm to about 600 nm, and
the second semiconductor is a transparent semiconductor that is configured to not substantially absorb light in a visible wavelength spectrum.

* * * * *